(12) United States Patent
Kim et al.

(10) Patent No.: US 11,018,274 B2
(45) Date of Patent: May 25, 2021

(54) SOLAR CELL PANEL

(71) Applicant: LG Electronics Inc., Seoul (KR)

(72) Inventors: Chungyi Kim, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/132,672

(22) Filed: Sep. 17, 2018

(65) Prior Publication Data

US 2019/0097069 A1 Mar. 28, 2019

(30) Foreign Application Priority Data

Sep. 22, 2017 (KR) .................. 10-2017-0122607
Jan. 18, 2018 (KR) .................. 10-2018-0006775

(51) Int. Cl.
*H01L 31/048* (2014.01)
*H01L 31/054* (2014.01)
*H01L 31/0468* (2014.01)
*B32B 17/10* (2006.01)
*H02S 20/26* (2014.01)
(Continued)

(52) U.S. Cl.
CPC ........ *H01L 31/048* (2013.01); *B32B 17/1011* (2013.01); *B32B 17/10018* (2013.01); *B32B 17/10091* (2013.01); *B32B 17/10266* (2013.01); *H01L 31/0468* (2014.12); *H01L 31/054* (2014.12); *H01L 31/0504* (2013.01);
(Continued)

(58) Field of Classification Search
CPC . H01L 31/048; H01L 31/054; H01L 31/0547; H01L 31/0549; H01L 31/0504; H02S 20/22; H02S 20/23; H02S 20/24; H02S 20/25; H02S 20/26; H02S 40/20; H02S 40/22
See application file for complete search history.

(56) References Cited

U.S. PATENT DOCUMENTS 5,279,680 A 1/1994 Chehab et al.
2007/0277810 A1 12/2007 Stock
(Continued)

FOREIGN PATENT DOCUMENTS

DE 4122721 C1 11/1992
KR 100750642 B1 8/2007
WO WO 2016118885 A1 7/2016

OTHER PUBLICATIONS

European Search Report issued in corresponding EP Patent Application No. 18195449.6, dated Jan. 17, 2019 (11 pages).

*Primary Examiner* — Tae-Sik Kang
(74) *Attorney, Agent, or Firm* — Finnegan, Henderson Farabow, Garrett & Dunner, LLP

(57) ABSTRACT

A solar cell panel includes a solar cell; a sealing member for sealing the solar cell; a first cover member positioned at a first surface of the solar cell on a first side of the sealing member; and a second cover member positioned at a second surface of the solar cell on a second side of the sealing member. The first cover member includes a base member and a colored portion having a lower light transmittance than the base member and partially formed on the base member to form a colored region. The second cover member includes a cover portion having a lower brightness than the colored portion and positioned at least an inactive region where the solar cell is not positioned.

20 Claims, 17 Drawing Sheets

(51) Int. Cl.
*H02S 40/22* (2014.01)
*H02S 20/22* (2014.01)
*H01L 31/05* (2014.01)

(52) U.S. Cl.
CPC .............. *H02S 20/22* (2014.12); *H02S 20/26* (2014.12); *H02S 40/22* (2014.12); *B32B 2369/00* (2013.01)

(56) References Cited

U.S. PATENT DOCUMENTS

| | | | |
|---|---|---|---|
| 2008/0006323 A1* | 1/2008 | Kalkanoglu | H01L 31/048 136/253 |
| 2009/0133739 A1* | 5/2009 | Shiao | H01L 31/048 136/251 |
| 2014/0326292 A1 | 11/2014 | Yordem et al. | |
| 2018/0337629 A1* | 11/2018 | Liu | H01L 31/02366 |

* cited by examiner

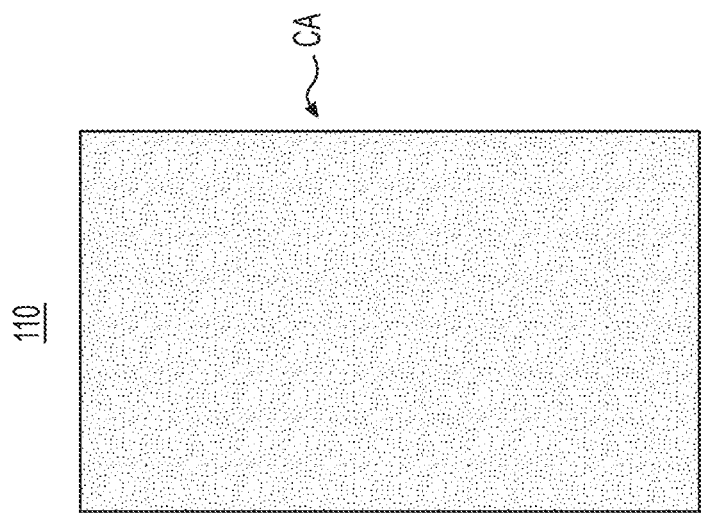
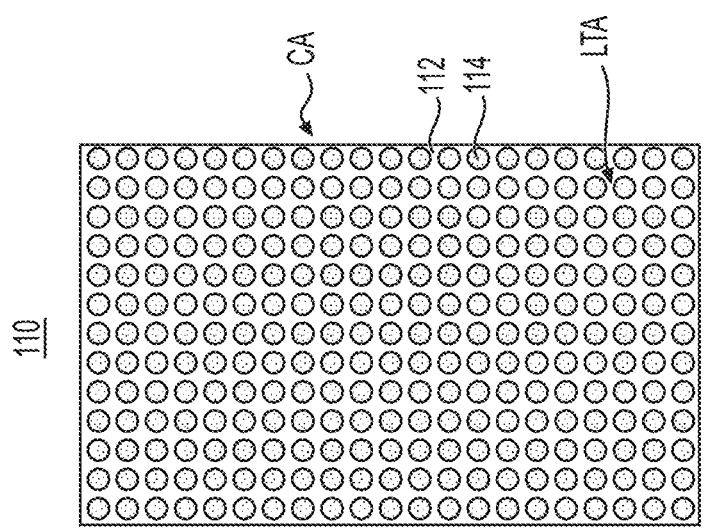
FIG. 4A
FIG. 4B

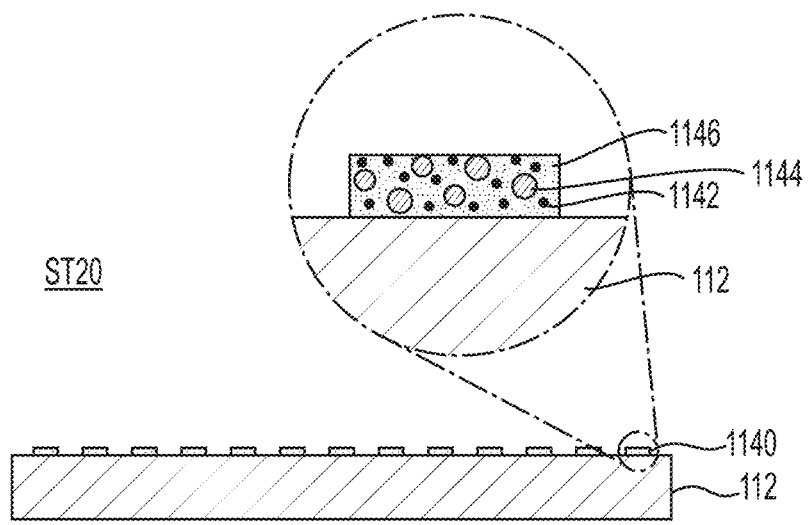
FIG. 8A
FIG. 8B
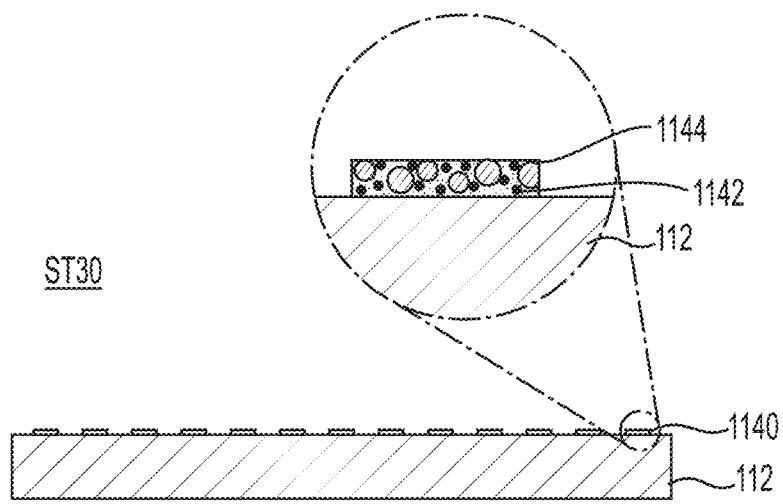
FIG. 8C

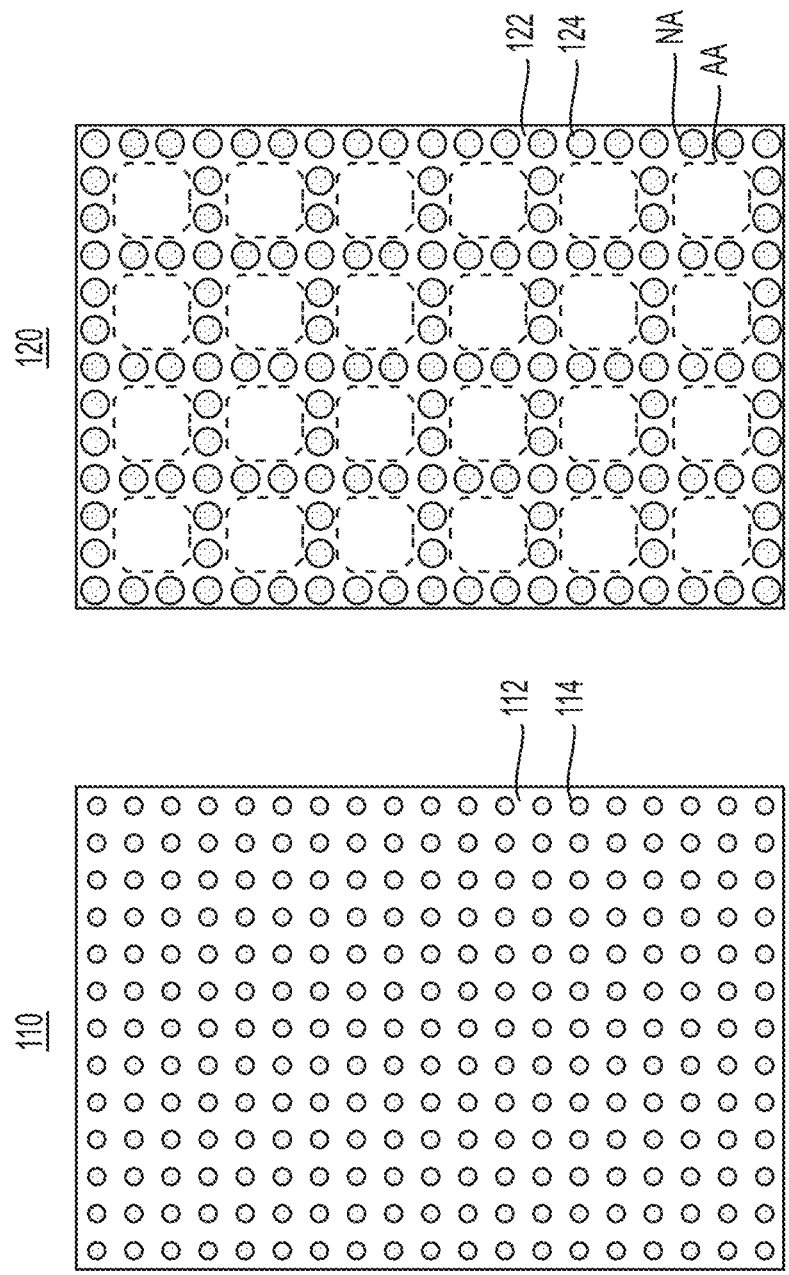

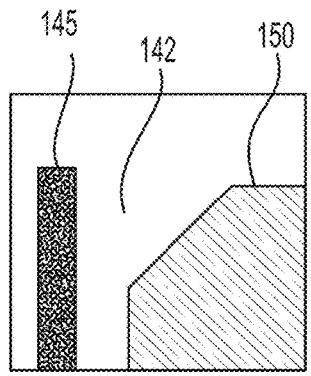
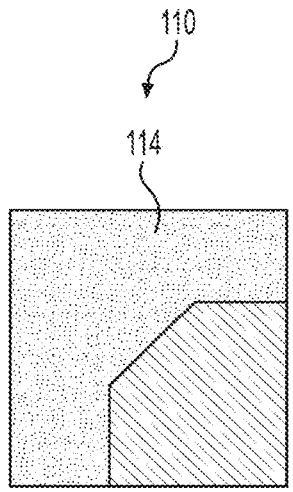
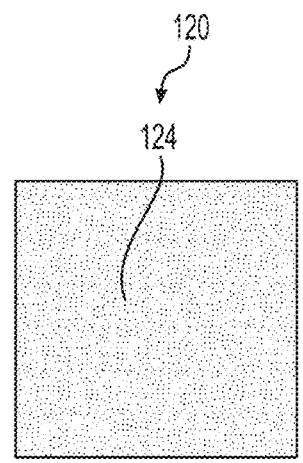
*FIG. 13A*  *FIG. 13B*  *FIG. 13C*
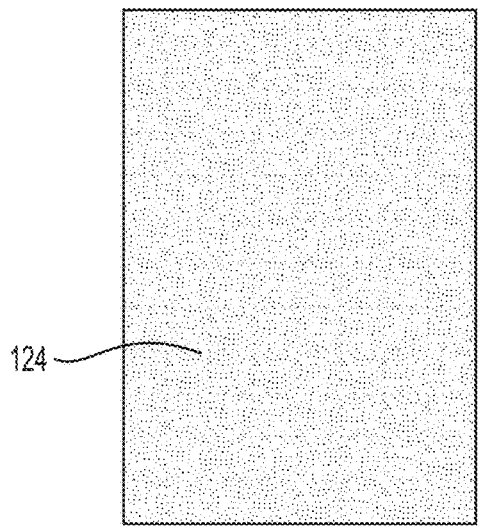
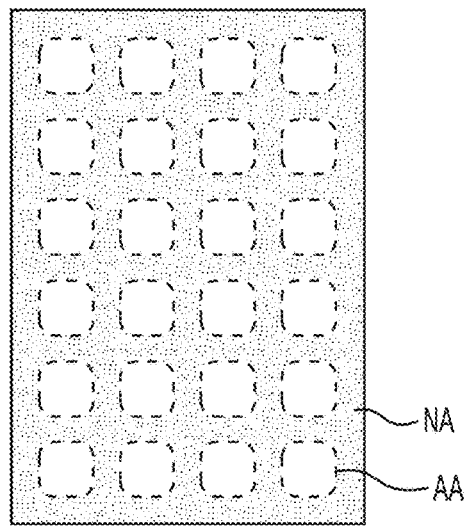
*FIG. 14A*  *FIG. 14B*

SOLAR CELL PANEL

CROSS-REFERENCE TO RELATED APPLICATION

This application claims the benefit of priority of Korean Patent Application No. 10-2017-0122607 filed on Sep. 22, 2017 and Korean Patent Application No. 10-2018-0006775 filed on Jan. 18, 2018 in the Korean Intellectual Property Office, the entire contents of both of which are incorporated herein by reference in their entirety.

BACKGROUND OF THE INVENTION

Field of the Invention

Embodiments of the invention relate to a solar cell panel, and, more particularly, to a solar cell panel having a building integrated structure.

Description of the Related Art

Recently, as the existing energy resources such as oil and coal are expected to be depleted, interest in alternative energy to replace them is increasing. Among them, solar cells are attracting attention as a next generation battery which converts solar energy into electric energy. A solar cell panel is formed through connecting a plurality of solar cells in series or in parallel by a ribbon and performing a packaging process for protecting the plurality of solar cells.

Generally, a solar cell panel is installed on a rooftop or a roof of a building. However, in an apartment or a high-rise building, a size of a solar cell panel that can be installed on a rooftop or a roof of a building is limited and it is difficult to efficiently use solar light. Recently, research on a solar cell panel having building integrated structure (a building integrated photovoltaic system BIPV) that is a solar cell panel installed on and integrated with an outer wall of a house, a building, etc. is actively carried out. By using a solar cell panel having a building integrated structure, light conversion can be performed in a wide area of an outer wall of a building, and thus, sun light can be effectively used.

However, when a solar cell panel having a building integrated structure is installed on an outer wall (particularly, a vertical wall) of a building, a glazing phenomenon may occur at a front surface of the solar cell panel having the building integrated structure because the solar cell panel having the building integrated structure is perpendicular to the bottom surface. In addition, in order to be applied to the outer wall of the building, a solar cell panel having a building integrated structure is required to have an excellent aesthetic property even after the solar cell panel having the building integrated structure is installed. Accordingly, it is required to diversify a color of a solar cell panel of a building integrated structure or to improve an appearance of a solar cell panel of a building integrated structure. However, a solar cell, or a wiring connected to a solar cell of the conventional solar cell panel having a building integrated structure may be seen from an outside as it is, or the conventional solar cell panel having the building integrated structure may only have a blue color, which is a color of a solar cell, and thus, and therefore, it is difficult to improve an aesthetics property and an appearance. Moreover, when the solar cell panel is used for a long time, a yellow color phenomenon of the solar cell panel may occur and an appearance of the solar cell panel may be deteriorated.

SUMMARY OF THE INVENTION

Therefore, embodiments of the invention have been made in view of the above problems, and the invention is to provide a solar cell panel having an excellent appearance and being able to prevent a glare phenomenon.

A solar cell panel according to an embodiment of the invention includes a solar cell, a sealing member for sealing the solar cell, a first cover member positioned at a surface of the solar cell on the sealing member, and a second cover member positioned at the other surface of the solar cell on the sealing member. The first cover member includes a base member and a colored portion having a lower light transmittance than the base member and partially formed on the base member to form a colored region. The second cover member includes a cover portion having a lower brightness than the colored portion and positioned at at least an inactive region where the solar cell is not positioned.

A solar cell panel according to another embodiment of the invention includes a solar cell, a sealing member for sealing the solar cell, a first cover member positioned at a surface of the solar cell on the sealing member, and a second cover member positioned at the other surface of the solar cell on the sealing member. The first cover member includes a base member and a colored portion having a lower light transmittance than the base member and partially formed on the base member to form a colored region. The second cover member includes a cover portion positioned at at least an inactive region where the solar cell is not positioned. A first cover ratio is a ratio of an area of the colored portion to an area of the colored region, a second cover ratio is a ratio of an area of the cover portion positioned at the inactive region to an area of the inactive region, and the second cover ratio is greater than the first cover ratio.

According to an embodiment of the invention, a predetermined color, an image, a pattern, or the like can be realized by a colored portion partially formed at a first cover member, and a solar cell, an interconnector, or so on can be prevented from being recognized by a cover portion of a second cover member. Accordingly, it is possible to improve an appearance of a solar cell panel while minimizing an output deterioration of the solar cell panel. Also, the colored portion can also prevent a glare phenomenon.

BRIEF DESCRIPTION OF THE DRAWINGS

FIGS. 4A and 4B are plan views showing an example of a first cover member included in a solar cell panel according to an embodiment of the invention.

FIGS. 8A to 8D are cross-sectional views showing steps of the manufacturing method shown in FIG. 7, respectively.

FIGS. 12A and 12B are plan views showing another example of a first cover member and a second cover member included in a solar cell panel according to another embodiment of the invention.

FIGS. 13A-13C are photographs of a part of an example of a solar cell panel according to an embodiment of the invention.

FIGS. 14A and 14B are plan views of other examples of a second cover member included in a solar cell panel according to an embodiment of the invention.

DETAILED DESCRIPTION OF THE EMBODIMENTS

Figure 1:
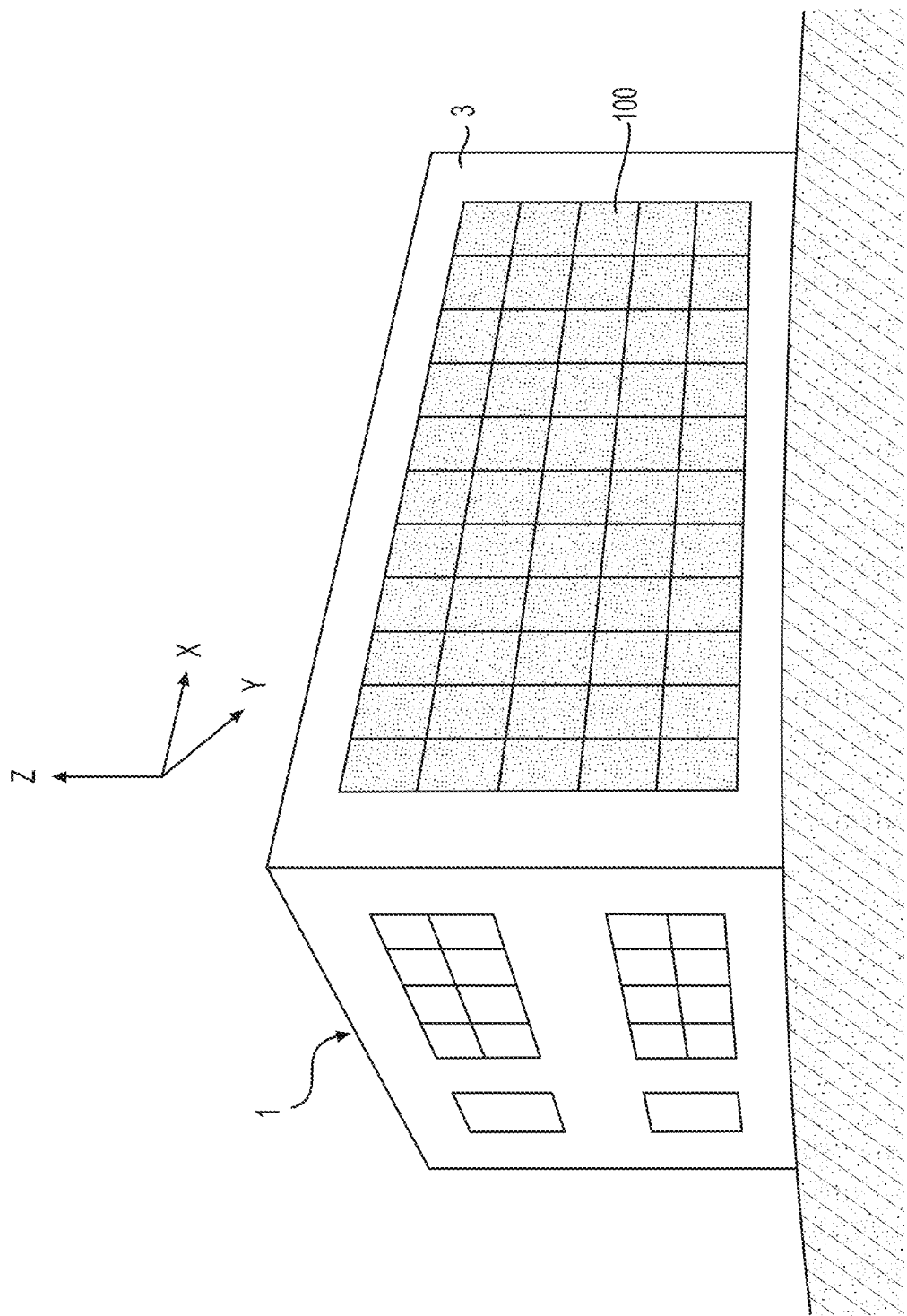
FIG. 1 is a schematic view showing an example of a building to which a solar cell panel according to an embodiment of the invention is applied.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell panel according to an embodiment of the invention will be described in detail with reference to the accompanying drawings.

FIG. 1 is a schematic view showing an example of a building to which a solar cell panel according to an embodiment of the invention is applied.

Referring to FIG. 1, a solar cell panel 100 according to an embodiment may have a building integrated structure. That is, the solar cell panel 100 is applied to an outer wall surface (for example, a vertical wall 3, a roof surface, etc.) of a building. However, embodiments are not limited thereto, and the solar cell panel 100 may be installed on a rooftop of the building 1 or other places other than the building 1. The solar cell panel 100 includes a solar cell 150 and thus generates electric power using solar light supplied from the sun.

In the embodiment, the solar cell panel 100 may have a predetermined color, image, or pattern. In this instance, a predetermined color, image, or pattern is provided to improve an aesthetic property of the building 1, while reducing a loss of solar light and minimizing or preventing a decrease of solar conversion efficiency. The solar cell panel 100 will be described in more detail.

Figure 2:
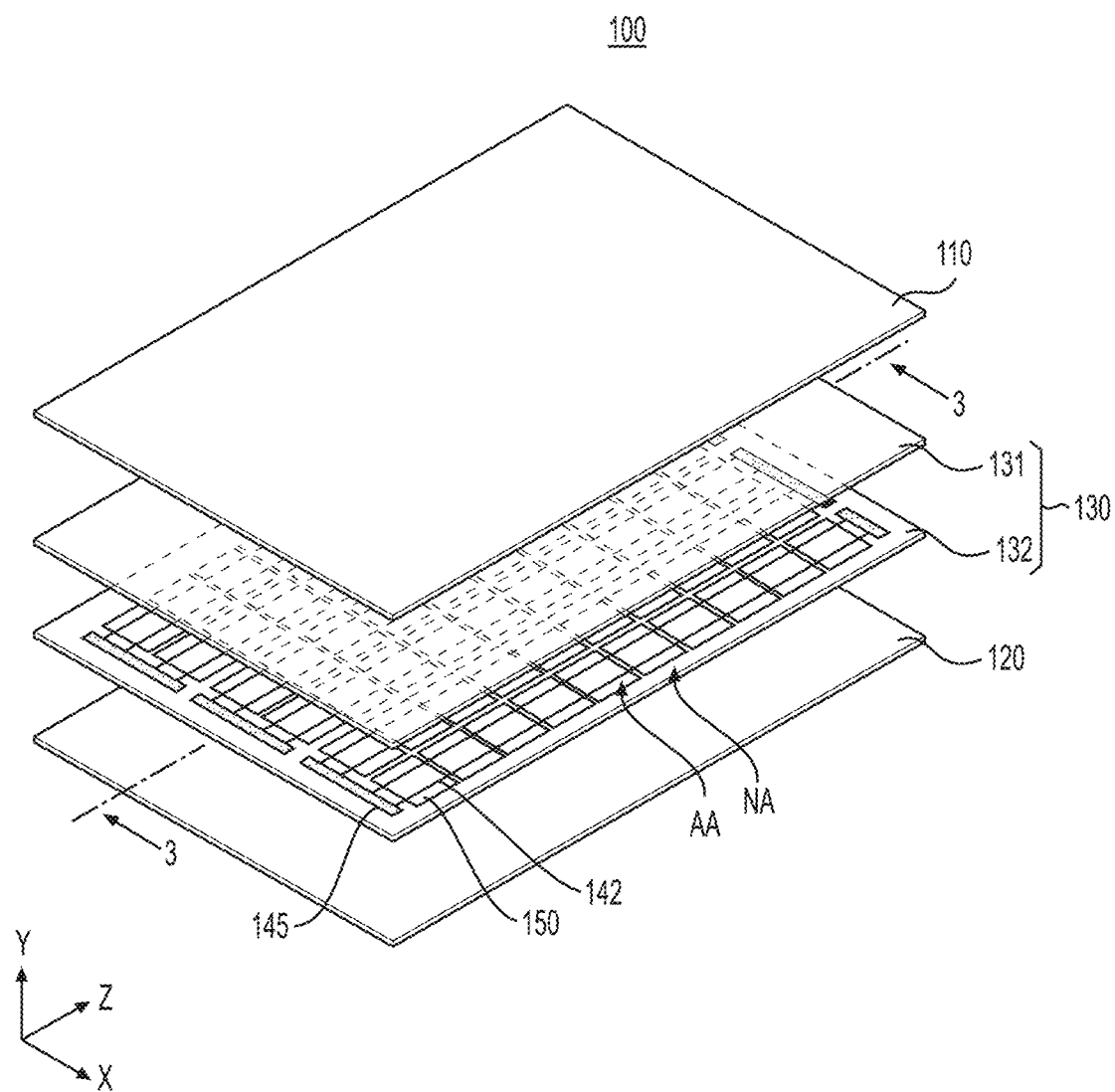
FIG. 2 is a perspective view schematically showing a solar cell panel according to an embodiment of the invention.
Figure 3:
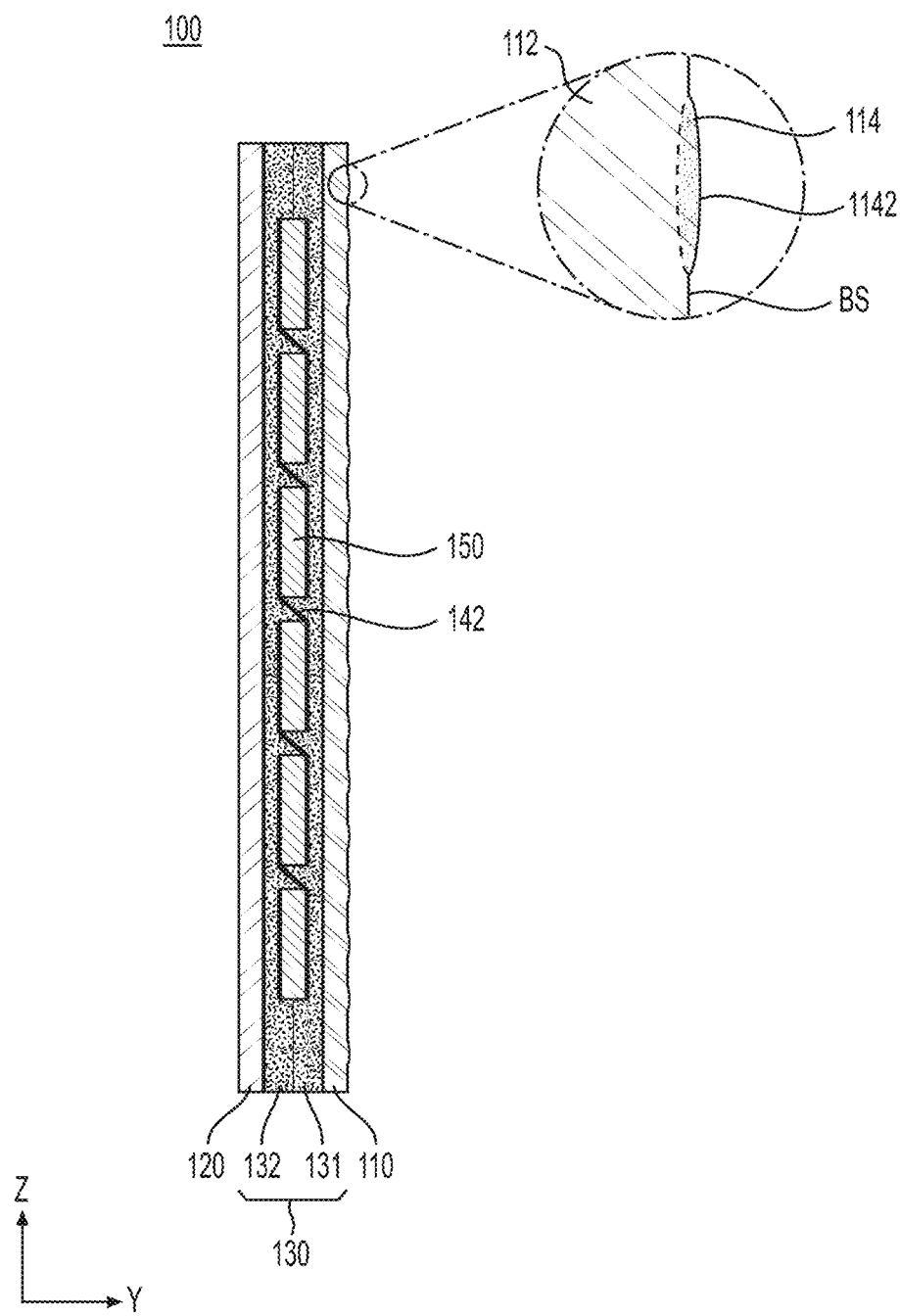
FIG. 3 is a cross-sectional view taken along line of FIG. 2.

FIG. 2 is a perspective view schematically showing a solar cell panel 100 according to an embodiment of the invention, and FIG. 3 is a cross-sectional view taken along line of FIG. 2. For simplicity and clarity, FIG. 2 shows a first cover member 110 in a simplified form and does not show a colored portion 114, and FIGS. 2 and 3 show a second cover member 120 in a simplified form and do not show a cover portion 124 (FIGS. 11A, 11B, 12A, 12B, 14A, and 14B).

Referring to FIGS. 2 and 3, a solar cell panel 100 according to an embodiment includes a solar cell 150, a sealing member 130 surrounding and sealing the solar cell 150, a first cover member (or a front member) 110 positioned at a surface (for example, a front surface) of the solar cell 150 on the sealing member 130, and a second cover member (or a back member) 120 positioned at the other surface (for example, a back surface) of the solar cell 150 on the sealing member 130.

In this instance, the solar cell 150 may include a photoelectric conversion portion that converts solar energy into electrical energy, and an electrode that is electrically connected to the photoelectric conversion portion and collects and transfers an electric current. For example, the solar cell 150 may be a solar cell that generates electrical energy from light of a wavelength range of 200 nm to 1400 nm. In the embodiment, for example, the photoelectric conversion portion may include a crystalline silicon substrate (for example, a silicon wafer) and a conductive region formed on or at the crystalline silicon substrate and including a dopant or a conductive region including an oxide. The solar cell 150 based on a crystalline silicon substrate having a high degree of crystallinity and having few defects has excellent electrical properties.

In the embodiment, a plurality of solar cells 150 are spaced apart from each other and may be electrically connected in series, parallel, or series-parallel by an interconnector 142 and 145. For example, a plurality of solar cells 150 may be connected in series to form a solar cell string extending along one direction. Any of various structures and shapes for connecting the solar cells 150, such as a ribbon and a wire, may be applied to the interconnector 142 and 145. Embodiments are not limited to a number, a structure, a shape, and the like of the interconnector 142 and 145.

However, embodiments are not limited thereto, and a structure, a type, etc. of the solar cell 150 may be variously modified. For example, the solar cell 150 may have any of various structures such as a compound semiconductor solar cell, a silicon semiconductor solar cell, and a dye-sensitized solar cell. It is also possible that only one solar cell 150 is provided in a solar cell panel 100.

The first cover member 110 is disposed on the sealing member 130 (for example, a first sealing member 131) to constitute one surface (for example, a front surface) of the solar cell panel 100, and the cover member 120 is disposed on the sealing member 130 (for example, a second sealing member 132) to constitute the other surface (for example, a back surface) of the solar cell panel 100. Each of the first cover member 110 and the second cover member 120 may be formed of an insulating material capable of protecting the solar cell 150 from external impact, moisture, ultraviolet rays, or the like. In the embodiment, the first and second cover members 110 and 120 have a predetermined structure so that the solar cell panel 100 has a predetermined color, image, or pattern, which will be described later in detail.

The sealing member 130 includes a first sealing member 131 positioned on the front surface of the solar cell 150 connected by the interconnector 142 and 145 and a second sealing member 132 positioned on the back surface of the solar cell 150 connected by the interconnector 142 and 145. The first sealing member 131 and the second sealing member 132 prevent moisture and oxygen from entering and chemically bind each element of the solar cell panel 100. The first and second sealing members 131 and 132 may be formed of an insulating material having translucency (for example, transparency) and adhesiveness. For example, the first sealing member 131 and the second sealing member 132 may be formed of an ethylene-vinyl acetate copolymer resin (EVA), a polyvinyl butyral, a silicone resin, an ester resin, an olefin resin, or so on. The second cover member 120, the second sealing member 132, the plurality of solar cells 150 connected by the interconnector 142 and 145, the first sealing member 131, and the first cover member 110 may be integrated through a lamination process to constitute the solar cell panel 100. More specifically, in the lamination process, heat and pressure are applied to the second cover member 120, the second sealing member 132, the plurality of solar cells 150 connected by the interconnector 142 and 145, the first sealing member 131, and the first cover member 110 in the state that they are laminated. Then, the first and second sealing members 131 and 132 are melted and cured and thus the plurality of solar cells 150 connected by the interconnectors 142 and 145 and the first and second cover members 110 and 120 are bonded to each other.

However, embodiments are not limited thereto. Accordingly, the first or second sealing member 131 or 132 may include any of various materials other than those described above and may have any of various shapes. For example, the first cover member 110 or the second cover member 120 may have any of various types (e.g., a substrate, a film, a sheet, etc.) or any of various materials.

However, embodiments are not limited thereto, and any of various structures and types may be applied to the solar cell panel 100.

Hereinafter, a portion where the solar cell 150 is positioned in the solar cell panel 100 is referred to as an active region AA, and a portion where the solar cell 150 is not positioned in the solar cell panel 100 is referred to as an inactive region (a non-active region) NA. If the solar cell 150 or the interconnector 142 and 145 connected thereto is recognized as it is or the second cover member 120 is recognized through the inactive region NA and thus a boundary of the solar cell 150 is clearly recognized, an esthetic property of the solar cell panel 100 may be deteriorated.

In the embodiment, the first cover member 110 and the second cover member 120 may have a predetermined structure so that the solar cell 150 or the interconnector 142 and 145 connected thereto is not recognized as it is or the second cover member 120 is not recognized through the inactive region NA and the boundary of the solar cell 150 is not clearly recognized. More specifically, the first cover member 110 and the second cover member 120 may have a predetermined structure in which the solar cell panel 100 has a predetermined color, image, pattern, or the like when the solar cell panel 100 is viewed with a naked eye away from a predetermined distance or more (for example, 1 m or more). For example, when the solar panel 100 is viewed at a distance sufficient to view an exterior of the building 1, an appearance of the building 1 can be improved while an output of the solar cell panel 100 is not greatly reduced. This will be described in more detail.

The first cover member 110 may have a light transmitting property that allows light to pass therethrough so as not to block the light incident on the solar cell 150. The first cover member 110 may include a base member 112 and a colored portion 114 partially formed on or at the base member 112 to constitute a colored region CA (refer to FIGS. 4A and 4B).

In this instance, the base member 112 may be formed of a material having an excellent light transmittance (for example, a transparent material). For example, the base member 112 may be a substrate, a film, a sheet, or the like, which is formed of glass, a resin (e.g., polycarbonate), or the like. The base member 112 may be formed of a single layer or a plurality of layers.

More particularly, the base member 112 may be formed of a glass substrate having excellent transparency, insulating property, stability, durability, and the like. For example, the base member 112 may be a low-iron glass substrate (for example, a low-iron tempered glass substrate) having a light transmittance of 80% or more (for example, 85% or more) for light having a wavelength of 300 nm to 1200 nm. By using a low-iron glass substrate including less iron, reflection of solar light can be prevented and a transmittance of solar light can be increased. When a low-iron tempered glass substrate is used, the solar cell 150 can be effectively protected from an external impact or the like.

In this instance, when the solar cell panel 100 is used as an exterior material of the building 1, the first cover member 110 or the solar cell panel 100 should have sufficient strength so that the solar cell panel 100 can withstand external impacts such as wind pressure, hail, snow load, and so on. For this purpose, the first cover member 110 or the base member 112 having a deflection of 5 mm or less generated in a direction of receiving a force when a force of 2400 $Nm^2$ is applied may be used. If the deflection exceeds 5 mm, durability against external impact such as wind pressure, hail, snow load, and so on may be not sufficient, and thus, it may be difficult to use as the exterior material of the building 1.

In one example, the base member 112 may have a thickness of 3 mm to 12 mm (more specifically, 3 mm to 8 mm), and may have an area of 0.04 to 10 $m^2$. If the thickness of the base member 112 is less than 3 mm, it may be difficult for the solar cell panel 100 to withstand an external impact or to have sufficient durability to be applied to the building 1. If the thickness of the base member 112 exceeds 12 mm, weight of the solar cell panel 100 may increase and it may be difficult to apply the solar cell panel 100 to the building 1. The area of the base member 112 is limited in consideration of structural stability, productivity, and the like of the solar cell panel 100. However, embodiments are not limited thereto, and the deflection, thickness, area, and the like of the base member 112 may have any of various values.

The colored portion 114 constituting the colored region CA may be partially formed on or at the base member 112. The colored region CA will be described in more detail with reference to FIGS. 4A, 4B, 5A, and 5B.

Figure 5B:
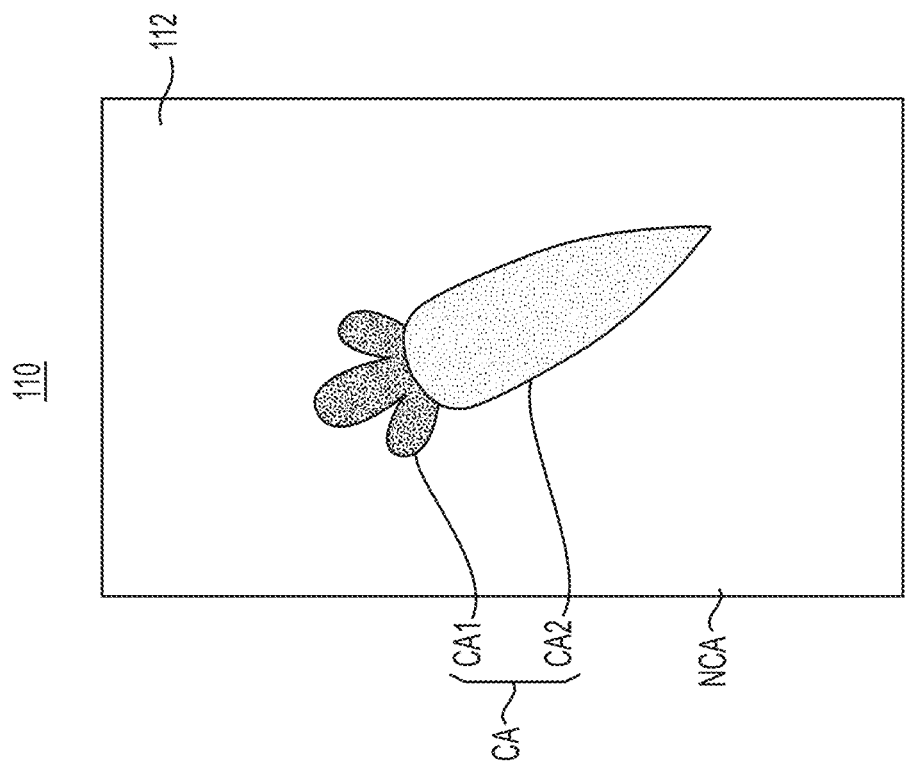
FIGS. 5A and 5B are plan views showing a modified example of a first cover member included in a solar cell panel according to an embodiment of the invention.
Figure 5A:
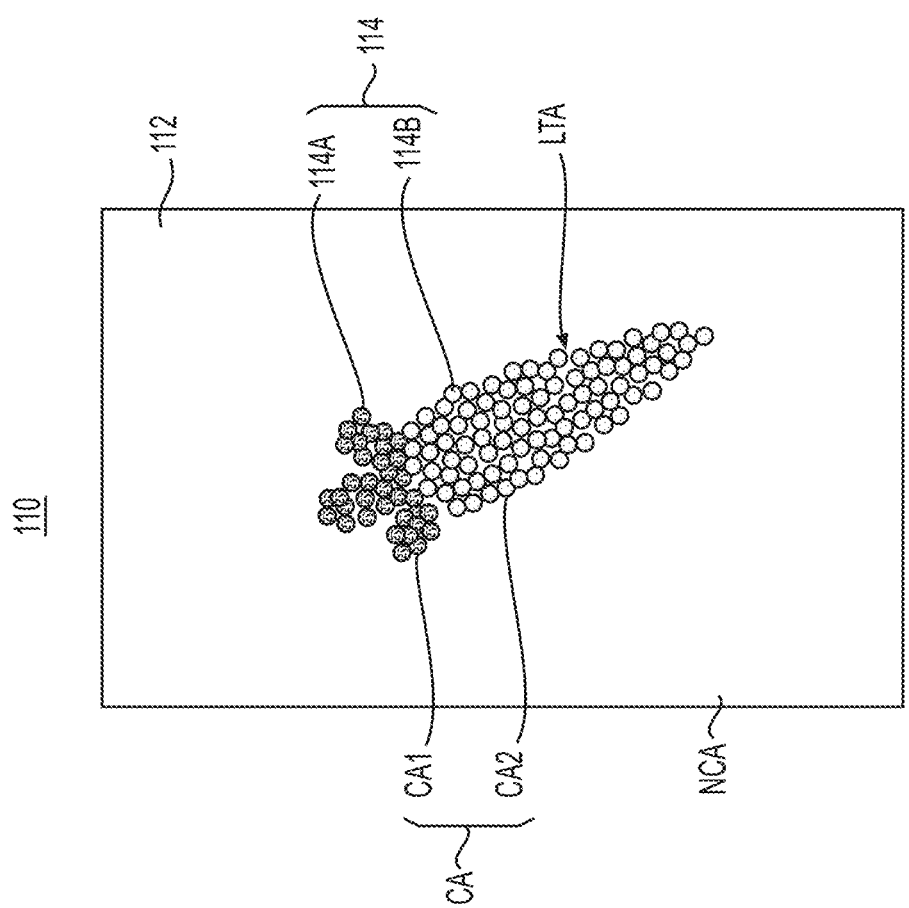

FIGS. 4A and 4B are plan views showing an example of the first cover member 110 included in the solar cell panel 100 according to an embodiment of the invention. FIGS. 5A and 5B are plan views showing a modified example of a first cover member 110 included in a solar cell panel 100 according to an embodiment of the invention. Each of FIGS. 4A and 5A shows an actual shape of the first cover member 110 where the colored portion 114 is formed, and each of FIGS. 4B and 5B shows a shape of the first cover member 110 when viewed at a certain distance apart from the solar cell panel 100.

In the embodiment, the colored region CA refers to a region recognized as being colored to form a certain color, image, pattern, or the like.

For example, as shown in FIGS. 4A and 4B, the colored region CA that is recognized to have a certain color, image, pattern, or the like is positioned in an entire region of the first cover member 110 or the base member 112. More specifically, colored portions 114 having dot shapes are arranged at regular intervals at the entire region of the base member 112 as shown in FIG. 4A, and thus, the colored region CA of the base member 112 where the colored portions 114 are positioned can be recognized as one color when the solar cell panel 100 is viewed at a certain distance apart from the solar cell panel 100.

As another example, as shown in FIGS. 5A and 5B, the colored region CA may be partially positioned on or at a portion of the first cover member 110 or the base member 112, and a non-colored region NCA may be positioned on or the other portion of the first cover member 110 or the base member 112. More specifically, when dot-shaped colored portions 114 having dot shapes are positioned at certain intervals at a part of the base member 112 while colored portions 114 are not positioned at the remaining region as shown in FIG. 5A, the colored region CA where the colored portions 114 are positioned may be recognized as a colored region CA having a certain color as shown in FIG. 5B and the remaining region may be regarded as a non-colored region (NCA) that is colorless.

When a plurality of colored portions 114 are provided, the plurality of colored portions 114 may have the same color, or may have different colors to achieve a desired image. When the plurality of colored regions CA having different colors are provided, a plurality of colored regions CA having different colors may be positioned adjacent to each other or independently. In FIGS. 5A and 5B, for example, two colored regions CA1 and CA2 having different colors are provided by colored portions 114a and 114b having two different colors. However, embodiments are not limited to a shape, color, and the like of the colored region CA, and various modifications are possible.

Figure 6A:
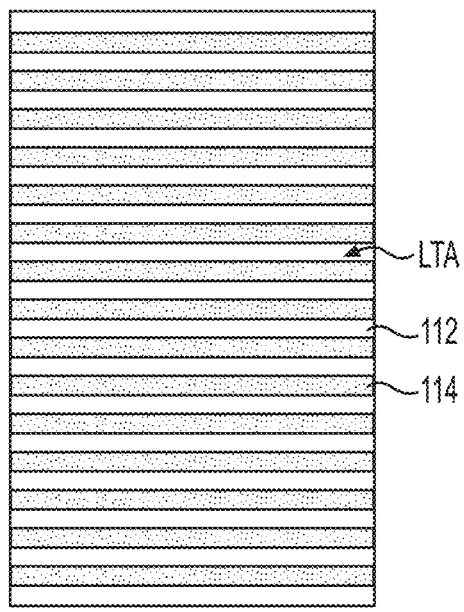
FIGS. 6A and 6B are plan views of other modified examples of a first cover member included in a solar cell panel according to an embodiment of the invention.
Figure 6B:
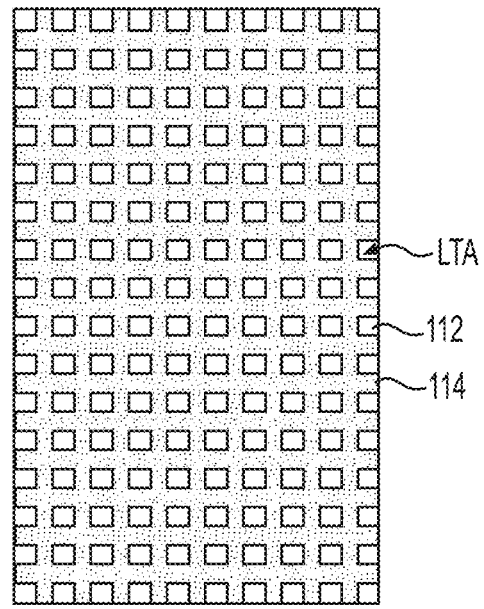

In FIGS. 4A, 4B, 5A, and 5B, it is exemplified that the colored portion 114 constituting the colored region CA has a dot shape having a circular shape, and a portion where the dotted colored portions 114 are not positioned in the colored region CA is connected as a whole to form a light transmitting portion LTA. However, embodiments are not limited thereto. The colored portion 114 may have a circular shape, an elliptical shape, a polygonal shape (a triangular shape, a rectangular shape, etc.), an irregular shape, or a combination thereof. As another example, as shown in FIG. 6A, a plurality of colored portions 114 may be elongated in one direction so as to have a straight shape so that the plurality of colored portions 114 may form a stripe shape. Then, a light transmitting portion LTA parallel to the plurality of colored portions 114 is positioned between the plurality of colored portions 114, and the colored portions 114 and the light transmitting portions LTA are alternatively arranged in a direction crossing the one direction. As other example, as shown in FIG. 6B, a colored portion 114 may have a checkered pattern including first portions extending in a first direction and second portions extending in a second direction crossing the first direction. Then, a portion having a dot shape surrounded by the first portions and the second portions may constitute a light transmitting portion LTA. In addition, the colored portion 114 may have any of various shapes.

When the plurality of colored portions 114 are spaced apart from each other by a predetermined distance and formed to have a predetermined area ratio, a plurality of colored portions 114 interposing or sandwiching the light transmitting portion (LTA) may be recognized as one portion. That is, the colored region CA in which the plurality of colored portions 114 are positioned is recognized as one color by the plurality of colored portions 114. Also, solar light passes through the light transmitting portion LTA formed of the base member 112 of a high light transmittance between the plurality of colored portions 114 and is supplied to the solar cell 150 through the first cover member 110 without a large loss.

For example, the colored portions 114 may have a width or a size of 0.2 to 10 mm, and a ratio of a total area of the colored portions 114 to a total area of the colored region CA may be 0.1 to 0.95 (more specifically, 0.1 to 0.5). When the plurality of colored portions 114 are viewed at a certain distance (for example, 1 m) in this range, they can be recognized as one color or as one portion. In this instance, when the ratio of the total area of the colored portions 114 to the total area of the colored region CA is 0.5 or less (i.e., the total area of the colored portions 114 is equal to or smaller than an area of the light transmitting portions LTA), the desired color, image, pattern, or the like can be realized with a little loss of light passing through the first cover member 110.

Alternatively, when the plurality of colored portions 114 are positioned at a certain distance from each other, the plurality of colored portions 114 can be recognized as one. For example, when the plurality of colored portions 114 are formed in a range of 40 to 300 dpi (dots per inch) (e.g., 80 to 300 dpi), the plurality of colored portions 114 are recognized as one to constitute the desired shape, image, pattern, or the like.

The colored portion 14 may have any of various colors considering a desired color, an image, or the like. A color, an area ratio, a thickness, or so on of the colored portion 114 and a type, a size, a concentration, a density, or so on of a coloring material 1142 included in the colored portion 114 are adjusted to adjust a transmittance of the first cover member 110. For example, the first cover member 110 having the colored portion 114 may have a light transmittance of 20% to 95% for light having a wavelength of 300 nm to 1200 nm. Particularly, for excellent photoelectric conversion efficiency, a light transmittance for light having a wavelength of 300 nm to 1200 nm may be 80% or more.

In the embodiment, even though the colored portion 114 includes the coloring material 1142, the colored portion 114 has a light transmittance, which is lower than that of the base member 112. Accordingly, a part of solar light can transmit through the colored portion 114. Then, solar light can also be transmitted through the colored portion 114, and a light loss by the colored portion 114 can be prevented or minimized. For example, the colored portion 114 may have a light transmittance of 20% or more (for example, 20% to 95%) for light having a wavelength of 300 nm to 1200 nm. However, embodiments are not limited thereto and various modifications are possible.

The colored portion 114 may be formed on the base member 112 or at the base member 112 and may be formed of any of various materials having a predetermined color. For example, the base member 112 may be formed of a tempered glass substrate, and the colored portion 114 may be formed of an integrated portion in which the coloring material 1142 is mixed in the tempered glass substrate to constitute a part of the tempered glass substrate. That is, the colored portion 114 may be a portion of the tempered glass substrate constituting the base member 112, but may be a portion including the coloring material 1142 unlike the other portion of the base member 112. The coloring material 1142 of the colored portion 114 may be formed by mixing with the material of the glass substrate by diffusing and penetrating into the base member 112 in a tempering process of a glass substrate constituting the base member 112. In this instance, the colored portion 114 may be formed integrally with the base member 112 to provide excellent physical durability and chemical durability.

The first cover member 110 having the colored portion 114 may be formed using a ceramic ink including a ceramic frit, the coloring material 1142, and a resin. Hereinafter, a method of manufacturing the first cover member 110 having the colored portion 114 described above will be described in detail with reference to FIGS. 7 and 8A to 8D.

Figure 7:
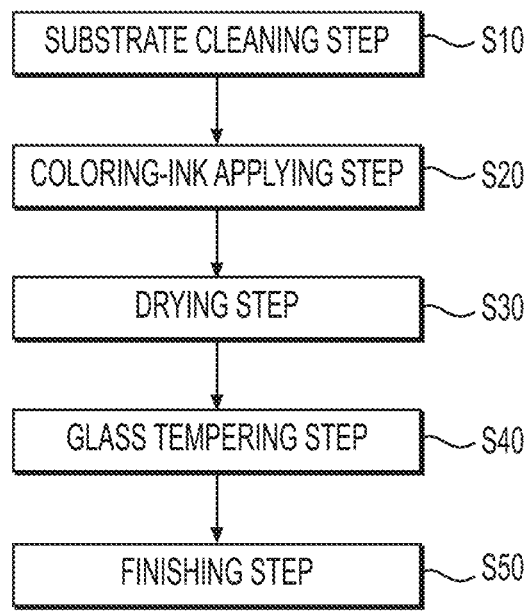
FIG. 7 is a flow chart showing a manufacturing method of an example of a first cover member included in a solar cell panel according to an embodiment of the invention.

FIG. 7 is a flow chart showing a method of manufacturing an example of the first cover member 110 included in the solar cell panel 100 according to the embodiment of the invention. FIGS. 8A to 8D are cross-sectional views showing steps of the manufacturing method shown in FIG. 7, respectively.

Referring to FIG. 7, a method of manufacturing the first cover member 110 according to the embodiment includes a substrate cleaning step S10, a coloring-ink applying step S20, a drying step S30, a glass tempering step S40, and a finishing step S50.

As shown in FIG. 8A, in the substrate cleaning step S10, a base member 112 formed of a non-tempered glass substrate (an unreinforced glass substrate) is cleaned and dried. Foreign matters, an oil film, or the like on the base member 112 can be removed by the substrate cleaning step S10.

In this instance, the non-tempered glass substrate may have a light transmittance of 80% or more (for example, 85% or more) to light having a wavelength of 300 nm to 1200 nm and a thickness of 3 mm or more. As an example, the non-tempered glass substrate may be a non-tempered glass substrate for construction.

Next, as shown in FIG. 8B, a coloring ink including a coloring material 1142, a ceramic frit 1144, and a resin 1146 is applied on the base member 112 to have a desired shape in the coloring-ink applying step S20, thereby forming a coloring layer 1140. In this instance, the coloring ink may be applied by a printing method, and any of various printing methods such as inkjet printing, digital printing, lithography printing, laser printing, and screen printing may be applied. However, embodiments are not limited thereto, and the coloring ink may be applied by any of various other methods.

As the coloring material 1142, a material capable of selectively absorbing or reflecting visible light of solar light to exhibit a unique color may be used. In one example, the coloring material 1142 may be a pigment or a dyestuff.

A pigment is a coloring matter formed of an inorganic material which is not soluble in water and most organic solvents, and exhibits a color by covering or coating a surface of an object to be colored. Pigments are excellent in chemical resistance, light resistance, weather resistance, and hiding power. That is, the pigment is strong against bases and acids, does not discolor and fade well when exposed to ultraviolet light, and can withstand the weather. A dyestuff is a coloring matter formed of an organic material dissolved in water or an organic solvent, and exhibit a color by coated on a surface of an object to be colored or penetrating into the object to be colored such as a fiber to exhibit color. The chemical resistance, light resistance, weather resistance, and hiding power of the dyestuff may be less than those of the above-mentioned pigment. Embodiments are not limited to a type and the like of the coloring material 1142, but any of various coloring materials 1142 may be used.

In one example, one or more materials may be used as the coloring material 1142 considering a desired color. For example, a material including at least one of copper (Cu), iron (Fe), nickel (Ni), chromium (Cr), uranium (U), vanadium (V), and the like may be used as the coloring material 1142 to exhibit a color of a series of red, yellow, or so on. A material including at least one of titanium (Ti), magnesium (Mg), and rutile may be used as the coloring material 1142 to exhibit a color of a series such as green, blue, or so on. A material constituting the coloring material 1142 may be in a form of an oxide, a carbide, a nitride, a sulfide, a chloride, or the like. For example, $CoAl_2O_4$ may be used as the coloring material 1142 to exhibit blue, and $Ti(Cr, Sb)O_2$ may be used as the coloring material 1142 to exhibit yellow. Such a material is merely an example, and embodiments are not limited thereto.

The resin 1146 is a material used to uniformly mix the coloring material 1142 and the ceramic frit 1144. Also, the resin 1146 is used so that the coloring ink has appropriate viscosity, fluidity, and the like when the coloring ink is applied. The resin 1146 may include any of various materials known as a resin.

The ceramic frit 1144 allows the coloring material 1142 to stably bind to the base member 112 (particularly, a glass substrate). The ceramic frit 1144 may include any of various materials known as a ceramic frit. For example, the ceramic frit 1144 may include a bismuth oxide (BiOx) as a base material, and may further include an aluminum oxide (AlOx), a silicon oxide (SiOx), a sodium oxide (NaOx), or the like. As an example, the ceramic frit 1144 may include a NAOS-based ceramic material including a bismuth oxide, a sodium oxide, an aluminum oxide, and a silicon oxide. The ceramic frit 1144 may remain partially after a heat-treatment, may be removed at the time of the heat-treatment, or may be difficult to be distinguished by being integrated with the base member 112. In the case where the ceramic frit 1144 remains, the ceramic frit 1144 may be determined or detected by any of various component analysis methods (for example, scanning electron microscopy-energy dispersive spectroscopy (SEM-EDX), or the like).

In this instance, the coloring ink may include sodium and potassium in an amount of $10 \times 10^{18}$ atoms/cc or less, respectively. If the coloring ink includes sodium or potassium in excess of the above-mentioned range, reliability of the solar cell panel 100 may be deteriorated due to a potential-induced degradation (PID) phenomenon. Also, the coloring ink may not include lead, and thus, environmental problems can be avoided. For example, an amount of sodium, potassium, and lead included in the coloring ink may be measured or determined by secondary ion mass spectrometry (SIMS).

Next, as shown in FIG. 8C, in the drying step S30, heat is applied to dry the colored layer 1140 and volatilizing the resin 1146. The resin 1146 is firstly volatilized so that the coloring material 1142 can be effectively mixed with the base member 112. For example, in the drying step S30, the colored layer 1140 may be dried at a temperature of 50 to 150° C. However, embodiments are not limited thereto, and the drying temperature may vary.

Figure 8D:
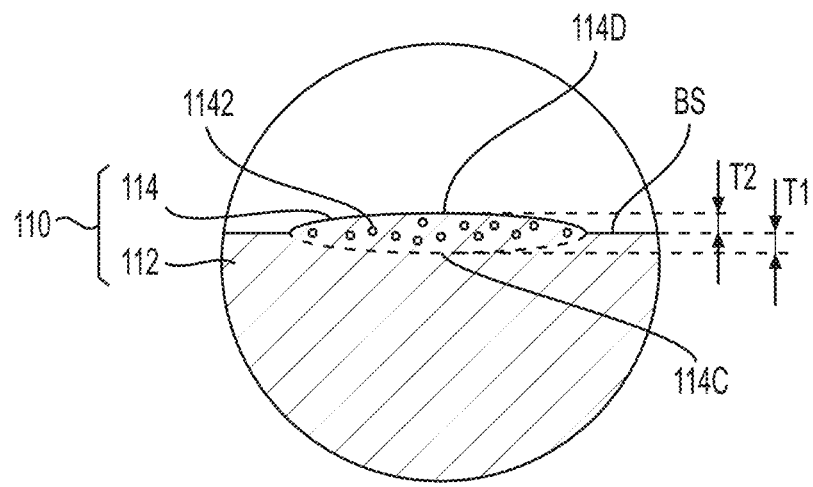

Next, as shown in FIG. 8D, in the glass tempering step S40, the non-tempered glass substrate constituting the base member 112 is tempered, strengthened, or reinforced by annealing. In this instance, the coloring material 1142 included in the colored layer 1140 is diffused into an inside of the glass substrate and is mixed with a material constituting the glass substrate so as to match the phase balance. Then, the colored portion 114 constituting a part of the tempered glass substrate is formed. The glass tempering step S40 may be performed at a temperature that the tempered glass substrate can be strengthened (for example, 700° C. or less, as an example, 600 to 700° C.). However, embodiments are not limited to the temperature of the glass tempering step S40.

Next, in the finishing step S50, the first cover member 110 on which the glass tempering step S40 has been performed is cleaned and dried. Then, the manufacture of the first cover member 110 having the integrated colored portion 114 is completed.

Figure 9:
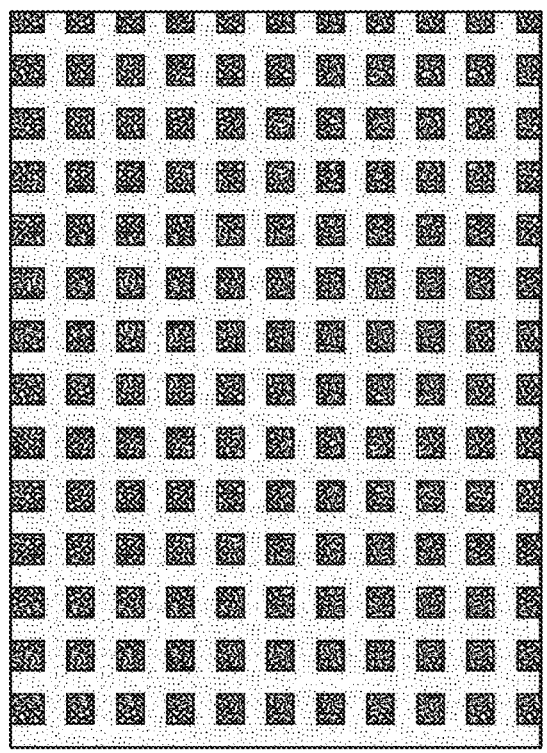
FIG. 9 is a photograph showing a plan view of a first cover member manufactured according to an embodiment of the invention.
Figure 10A:
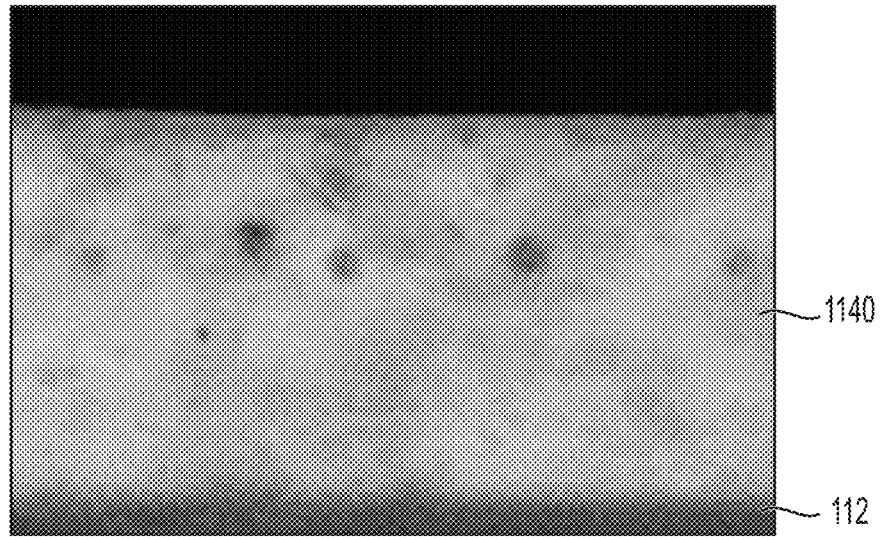
FIGS. 10A and 10B are photographs showing cross-sections of a first cover member manufactured according to an embodiment of the invention before and after a glass tempering step, respectively.
Figure 10B:
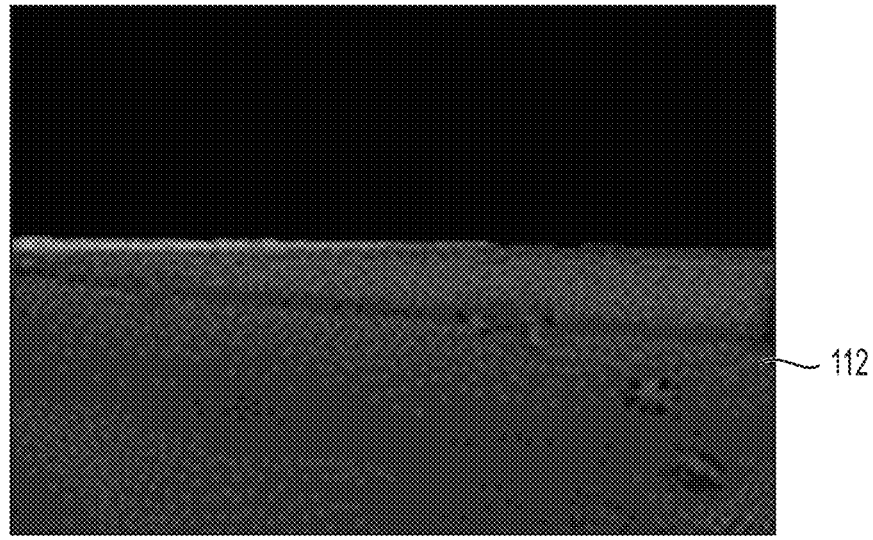

Referring to FIGS. 9, 10A, and 10B, the first cover member 110 having the colored portion 114 manufactured by the manufacturing method according to the embodiment will be described in more detail. FIG. 9 is a photograph showing a plan view of a first cover member 110 manufactured according to an example of a manufacturing method of a first cover member 110 according to an embodiment of the invention. FIGS. 10A and 10B are photographs showing cross-sections of a first cover member 110 manufactured according to an example of a manufacturing method of a first cover member 110 according to the embodiment of the invention before and after the glass tempering step S40, respectively.

In FIG. 9, it can be seen that, for example, a colored portion in an upper portion and another colored portion in a lower portion have different colors, different brightness, or different chromas. It can be seen that a coloring ink or a colored layer 1140 is formed to have a large thickness before the glass tempering step ST40 as shown in FIG. 10A, while no coloring ink remained after the glass tempering step S40 as shown in FIG. 10B.

In the above description, it is exemplified that the first cover member 110 having the colored portion 114 integrated with the base member 112 formed of the tempered glass substrate has been described as an example.

According to this, as shown in FIG. 3 and FIG. 8D, the colored portion 114 is formed so as to correspond to a part of the base member 112 in a thickness direction of the base member 112 at one surface of the base member 112. More specifically, a first portion 114c of the colored portion 114 is recessed into the base member 112 and a second portion 114d of the colored portion 114 protrudes from a substrate surface (BS) of the base member 112. The first portion 114c and the second portion 114d may have a rounded portion and be formed at one surface of the base member 112. However, embodiments are not limited thereto, and the shape of the colored portion 114 adjacent to the base member 112 may have a different shape. As an example, the colored portion 114 may be formed to be flat with a uniform thickness. Various other variations are possible.

In this instance, a thickness T1 of the first portion 114c may be greater than a thickness T2 of the second portion 114d. According to this, the coloring material 1142 or the colored portion 114 can be stably integrated with the base member 112. In addition, it is possible to reduce a protruding thickness of the second portion 114d, thereby preventing unnecessary deterioration of appearance and light refraction. However, embodiments are not limited thereto, and the thickness T1 of the first portion 114c may be equal to or less than the thickness T2 of the second portion 114d.

As an example, the colored portion 114 may include a pigment as the coloring material 1142 and may have a thickness of 1 to 50 μm (for example, 1 to 10 μm, more specifically, 2 to 5 μm). In this instance, if the thickness of the colored portion 114 is less than 1 μm, a density of the coloring material 1142 decreases and it may be difficult to exhibit a desired color. If the thickness of the colored portion 114 exceeds 50 μm, a light transmittance of the colored portion 114 may be lowered and peeling or cracking of the colored portion 114 may occur.

As another example, the colored portion 114 may include a dyestuff as the coloring material 1142 and may have a thickness of 100 nm to 500 nm. In this instance, if the thickness of the colored portion 114 is less than 100 nm, a density of the coloring material 1142 decreases and it may be difficult to exhibit a desired color. If the thickness of the colored portion 114 exceeds 500 nm, a light transmittance of the colored portion 114 may be deteriorated and solar light may be lost due to interference with the color portion 114.

In the drawings, it is exemplified that the colored portion 114 is positioned at an outer surface of the base member 112 of the first cover member 110. Then, a glaze phenomenon that may occur when the solar cell panel 100 is applied to the building 1 can be prevented or minimized by the colored portion 114. However, embodiments are not limited thereto, and the colored portion 114 may be positioned at an inner surface of the base member 112. Various other variations are possible.

Meanwhile, the solar cell panel 100 and the second cover member 120 included therein according to the embodiment will be described in detail with reference to FIGS. 2, 3, 11A, 11B, and 13A-13C.

Figure 11B:
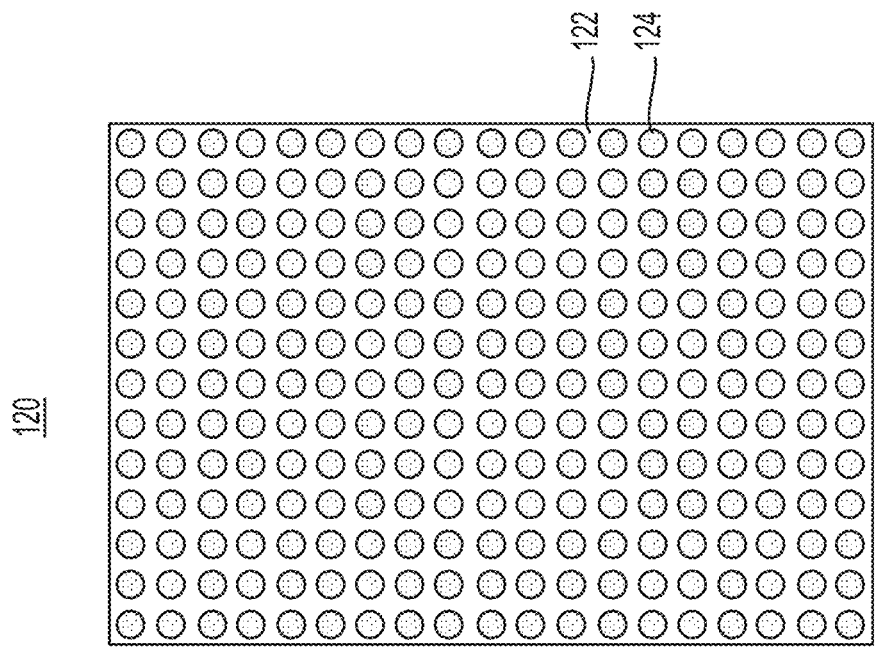
FIGS. 11A and 11B are plan views showing an example of a first cover member and a second cover member included in a solar cell panel according to an embodiment of the invention.
Figure 11A:
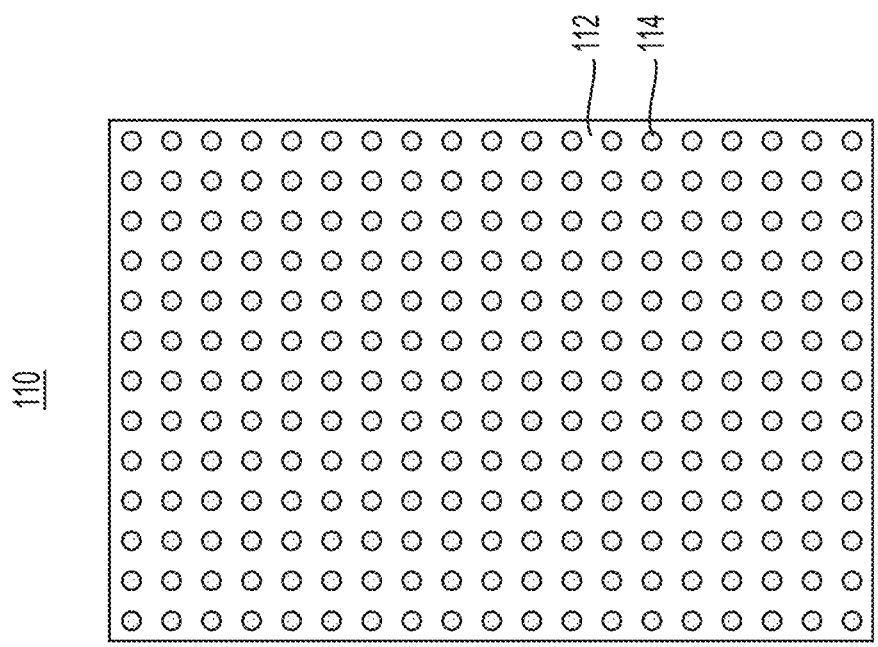

FIGS. 11A and 11B are plan views showing an example of the first cover member 110 and the second cover member 120 included in the solar cell panel 100 according to an embodiment of the invention. FIGS. 12A and 12B are plan views showing another example of a first cover member 110 and a second cover member 120 included in a solar cell panel 100 according to an embodiment of the invention. FIGS. 13A-13C are photographs of a part of an example of a solar cell panel 100 according to the embodiment of the invention.

Referring to FIGS. 11A, 11B, 12A, and 12B, in the embodiment, the second cover member 120 may include a cover portion 124 positioned at least in an inactive region NA. In FIGS. 11A, 11B, 12A, and 12B, it is exemplified that the second cover member 120 has a base portion 122 and a cover portion 124 partially formed on or at the base portion 122.

In this instance, the base portion 122 may have a light transmission such that light can be transmitted so as not to block the light incident on the solar cell 150. Here, the base portion 122 may be formed of a material having a good light transmittance (e.g., a transparent material). For example, the base portion 122 may have a light transmittance of 80% or more (for example, 85% or more) for light having a wavelength of 300 nm to 1200 nm. However, embodiments are not limited thereto, and the base portion 122 may be formed of a semi-permeable material, a non-transmissive material, a reflective material, or the like.

In the embodiment, the cover portion 124 may have relatively low brightness or have a relatively low light transmission, and/or a second cover ratio may be greater than a first cover ratio. For example, the brightness of the cover portion 124 may be lower than that of the colored portion 114, or the second cover ratio may be lower than the first cover ratio when the cover portion 124 has a color of the same color as or a color having brightness lower than that of the colored portion 114.

In this instance, the relatively low brightness may mean brightness lower than brightness of the colored portion 114, and the relatively low light transmittance may mean a light transmittance lower than a light transmittance of the base member 112 and/or the base portion 122.

The cover portion 124 may have an achromatic color other than white, an opaque color, or a color of the same series as that of the solar cell 150. 11. For example, a color of the cover portion 124 may be black, gray, blue, green, brown, the color of the same series as that of the solar cell 150, or a mixed color thereof. Since white has a high brightness, it may be difficult to form the cover portion 124 by using it. For example, when the cover portion 124 is formed of the color of the same series as that of the solar cell 150, a color uniformity is achieved and the solar cell panel 100 has uniformity of color as a whole, thereby further improving an aesthetic property. However, embodiments are not limited thereto. Any of various colors other than the above-mentioned color, which has brightness lower than that of the colored portion 114 or a light transmittance lower than that of the base member 112 and/or the base portion 122, may be used.

The first cover ratio may refer to a ratio of an area of the colored portion 114 to an area of the colored region CA and the second cover ratio may refer to a ratio of an area of the cover portion 124 positioned at the inactive region NA to an area of the inactive region NA.

According to this, the cover portion 124 positioned at the inactive region NA where the solar cell 150 is not positioned has a lower brightness or a larger cover ratio than the colored portion 114, the boundary of the solar cell 150, the interconnector 142 and 145, or the like can be prevented from being recognized.

That is, when, on the solar cell 150 and the interconnector 142 and 145 as shown in FIG. 13A, the first cover member 110 having the colored portion 114 is positioned as shown in FIG. 13B, the color of the colored portion 114 can be recognized while the boundary of the solar cell 150 and the boundary of the interconnectors 142 and 145 may be recognized to some degree. In this state, when the second cover member 120 having the cover portion 124 is put together as shown in FIG. 13C, the color of the colored portion 114 is recognized and the boundary of the solar cell 150 and the boundary of the interconnector 142 and 145 are difficult to be recognized by interference of the colored portion 114 and the cover portion 124.

As an example, the second cover ratio may be 0.5 to 1. That is, the ratio of the area of the cover portion 124 formed at the inactive region NA to the total area of the inactive region NA may be 0.5 to 1. Within the range of the second cover ratio, it is possible to effectively prevent the boundary of the solar cell 150 from being recognized or the interconnector 142 and 145 or the like from being recognized.

As an example, the second cover member 120 may be formed as a whole so as to correspond to the active region AA and the inactive region NA as shown in FIGS. 11A and 11B. Alternatively, the second cover portion 124 may be formed only at a portion corresponding to the inactive region NA and not be formed at the active region AA or is formed partially at a portion including the inactive region NA. When the cover portion 124 is not formed at the active region AA or is partially formed, a cost for forming the cover portion 124 can be reduced.

In an exemplary embodiment, the cover portion 124 having a dot shape is placed on the base portion 122 in FIGS. 11A and 11B. Embodiments are not limited thereto. That is, as shown in FIG. 14A, a cover portion 124 may be formed on an entire portion of a second cover member 120. In the embodiment of FIG. 14A, a base portion 122 may have a color having a low light transmittance or a color having low brightness, and thus, may constitute the cover portion 124 by itself. That is, base portion 122 and cover portion 124 may be formed by a single layer. Alternatively, as shown in FIG. 14B, a cover portion 124 may be formed entirely corresponding to the inactive region NA. As such, the cover portion 124 may be formed of a single structure that covers at least an entire portion of an inactive region NA. Alternatively, the cover portion 124 may have other shapes, such as a stripe shape. Various other variations are possible.

The second cover member 120 may be formed of a glass substrate on which a metal film (for example, silver (Ag) or aluminum coated to have a black color) is deposited, or a metal plate (for example, a steel plate). In the case where the second cover member 120 is a glass substrate on which a metal film is deposited, the metal film corresponds to the cover portion 124 and the glass substrate corresponds to the base portion 122. When the second cover member 124 is a metal plate, the metal plate is both of the base portion 122 and the cover portion 124. In addition, the second cover member 120 or the base portion 122 may be formed of a fiber reinforced plastic, a sheet, or so on including a resin (e.g., polycarbonate or the like) and having a light transmitting property, a non-light transmitting property, or an anti-reflective property. The cover portion 124 including a pigment, a dye, or the like may additionally formed on the base portion 122, or a material for forming the cover portion 124 may be included in the cover portion 124. Various other variations are possible. When the base portion 122 is formed of a resin or the like, the base portion 122 may be formed of a single layer or a plurality of layers.

As described above, the cover portion 124 may be positioned on a surface of the second cover member 120 to have one shape and color. Also, the cover portion 124 may have any of various shapes, colors, or the like, or may be positioned on both surfaces of the second cover member 120. Various modifications are possible. For example, a first cover portion having a dot shape may formed on a surface of the second cover member 120 and a metal film may be formed on the other surface of the second cover member 120.

According to the embodiment, a predetermined color, an image, a pattern, or the like can be realized by the colored portion 114 partially formed at the first cover member 110, and the solar cell 150, the interconnector 142 and 145, or so on can be prevented from being recognized by the cover portion 124 of the second cover member 120. Accordingly, it is possible to improve an appearance of the solar cell panel 100 while minimizing an output deterioration of the solar cell panel 100. The colored portion 114 can also prevent a glare phenomenon. Also, even when viewed from a lateral side, the desired color, image, pattern, etc. can be maintained while a color change is not generated and the colored portion 114 is not recognized. For example, when the colored portion 114 of the first cover member 110 and the cover portion 124 of the second cover member 120 have the same or similar pattern, a design uniformity of the solar cell panel 100 can be achieved to secure an esthetic property.

On the other hand, if pigments, dyestuffs, or the like are added to a sealing member or the like to achieve a certain color, electric conductivity and a sealing property of the sealing member may be adversely affected, which may cause an undesirable property change. As a result, reliability can be reduced. In another conventional art, when a separate colored portion is positioned, a color of the colored portion may be recognized differently from the other member when viewed from the lateral side or from a bright circumstance, and an aesthetic property may be deteriorated.

As described above, when the colored portion 114 has a structure integrated with the base member 112, physical and chemical durability of the colored portion 114 and the first cover member 110 including the colored portion 114 can be improved. That is, it is resistant to chemical substances, heat, moisture, etc. and has a long life of coloring and is not damaged by physical impact (scratch, etc.). On the other hand, if the colored portion 114 is formed of a separate material, it may be relatively vulnerable to chemicals, heat, moisture, physical impact and the like. The first cover member 110 having the above structure according to the embodiment can be easily formed in a process of tempering non-tempered glass, and a cost can also be reduced. On the other hand, if a resin other than a glass substrate is used for the base member 112, durability against ultraviolet rays, physical and chemical durability may not be excellent, and, if additional members are added to compensate for this, a process cost may increase.

As described above, when each of the first cover member 110 and the second cover member 120 includes a structure including a glass substrate (for example, a tempered glass substrate), excellent durability can be realized.

Figure 15:
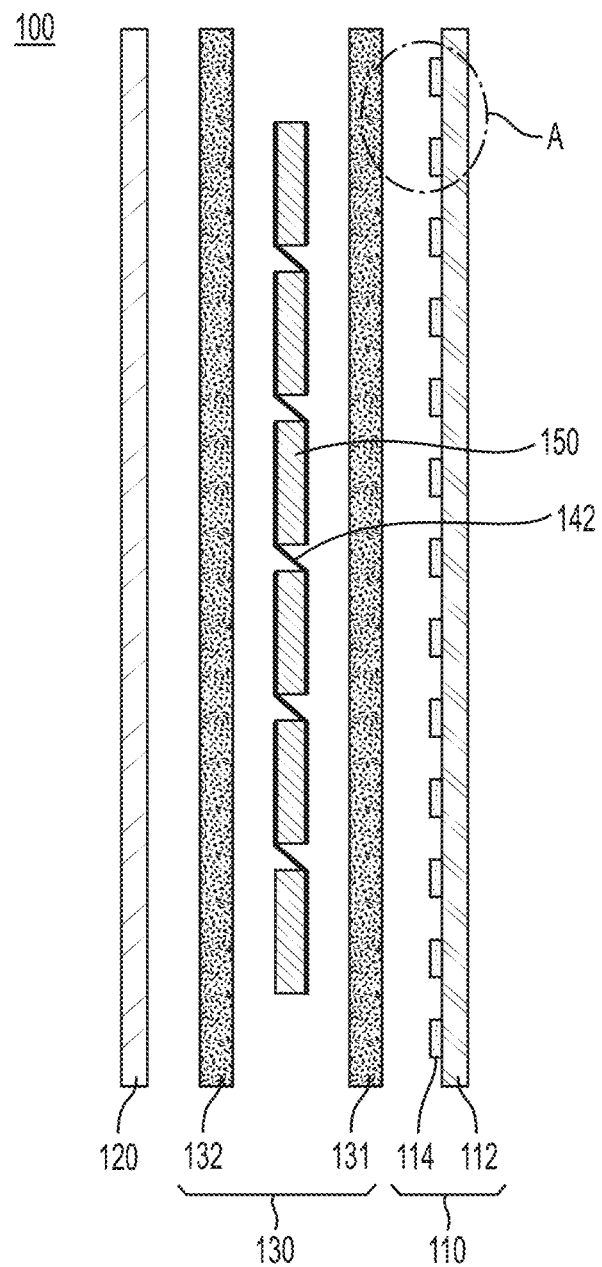
FIG. 15 is an exploded cross-sectional view schematically showing a solar cell panel according to another embodiment of the invention.
Figure 16:
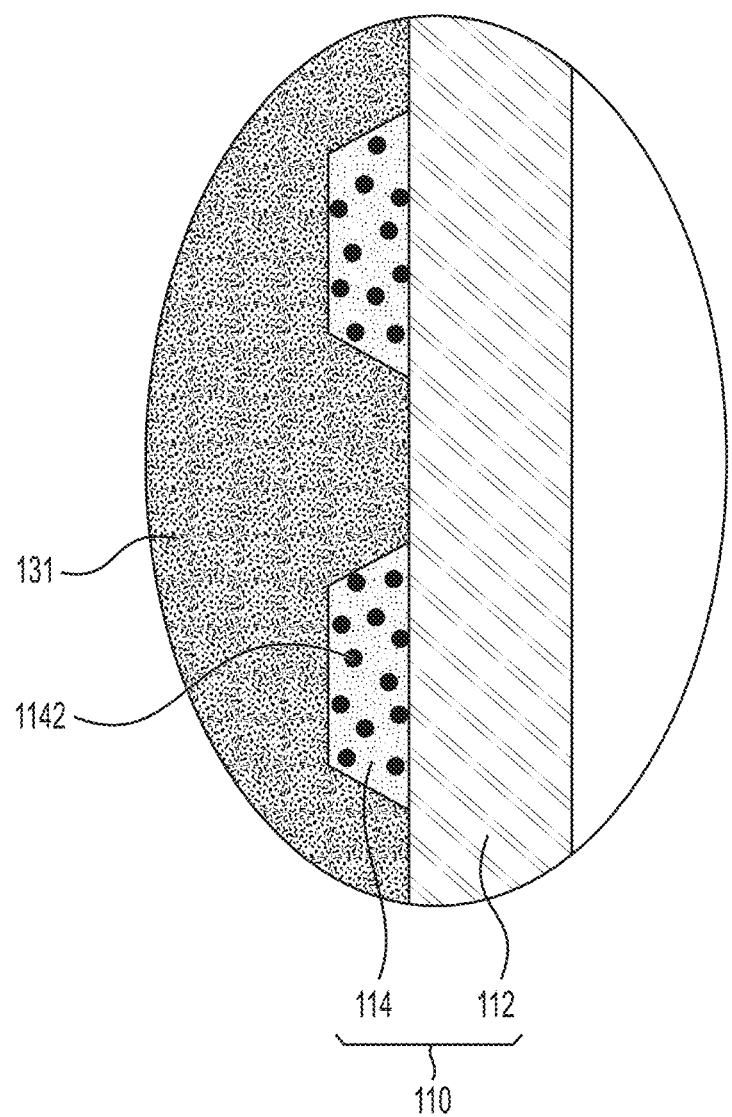
FIG. 16 is a partial cross-sectional view showing an enlarged view of portion A in FIG. 15.
Figure 17:
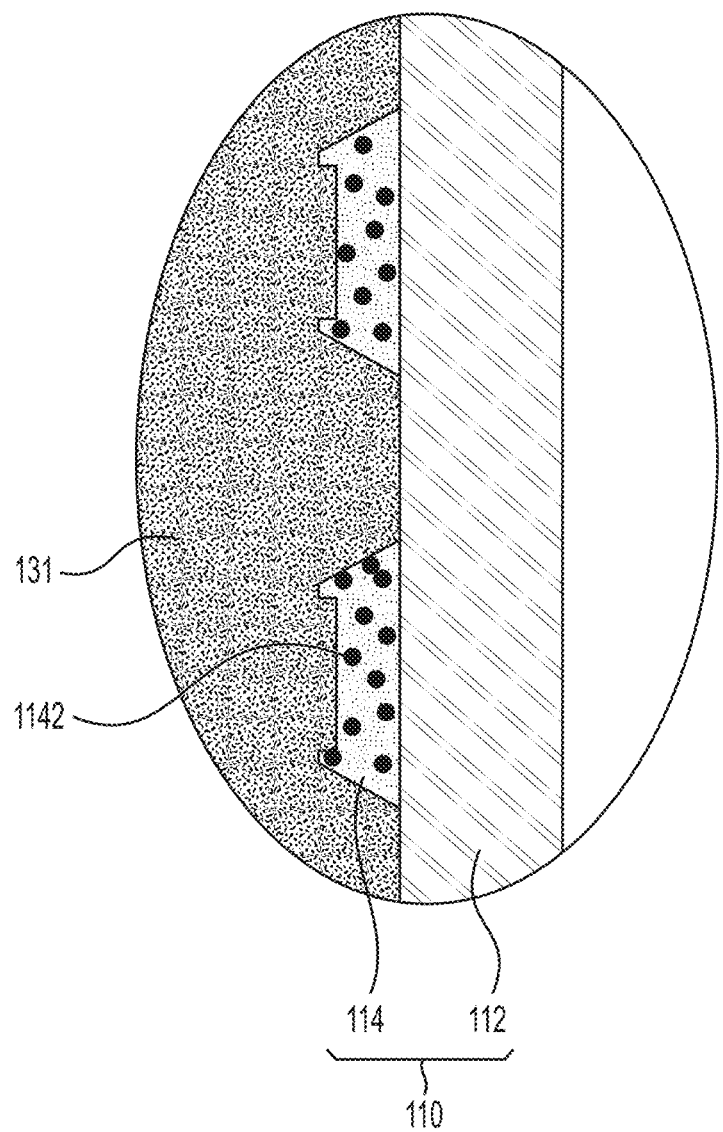
FIG. 17 is a partial cross-sectional view of a solar cell panel according to a modified embodiment of the invention.

In the above description and drawings, it is exemplified that the colored portion 114 is formed of a portion integrated with the tempered glass. However, embodiments are not limited thereto. Thus, the base member 112 may be formed of another glass, resin, or so on, and/or the colored portion 114 may be formed on the base member 112 as a separate layer from the base member 112. Such an example will be described in detail with reference to FIGS. 15-17. The detailed description will be omitted for the same or extremely similar parts as the above description, and only the different parts will be described in detail FIG. 15 is an exploded cross-sectional view schematically showing a solar cell panel according to another embodiment of the invention. FIG. 16 is a partial cross-sectional view showing an enlarged view of portion A in FIG. 15. FIG. 17 is a partial cross-sectional view of a solar cell panel according to a modified embodiment of the invention.

Referring to FIG. 15, in the embodiment, a colored portion 114 formed of a separate material and a separated layer may be disposed on a base member 112. In this instance, the colored portion 114 may be formed on a substrate surface of the base member 112 and protrude from the substrate surface of the base member 112. For example, in the drawing, it is exemplified that the colored portion 114 is positioned on a surface facing the solar cell 150 and protruded toward the solar cell 150. However, embodiments are not limited thereto, and the colored portion 114 may protrude toward the opposite side (i.e., outside) of the solar cell 150.

Referring to FIG. 16, a first surface of a colored portion 114 adjacent to the base member 112 may be formed wider than a second surface of a colored portion 114 opposite to the first surface. In this case, since an area of the colored portion 114 and the base member 112 is sufficient, the colored portion 114 can be stably formed with a large adhesive force. When the second surface is adjacent to (for example, in contact with) a first sealing member 131 as shown in FIG. 16, a narrow area of the colored portion 114 is adjacent to the first sealing member 131, and thus, the colored portion 114 and the first sealing member 131 can be bonded without pores or defects.

The colored portion 114 may be formed by forming a colored layer 1140 (in FIG. 8B) on the base member 112 through vapor deposition or the like, and performing a heat-treatment for drying or firing. That is, a coloring material may be coated on the base member 112 using a shadow mask. For example, after the shadow mask is fixed on the base member 112, the coloring material may be physically or chemically deposited to form the coloring layer 1140. The coloring material is deposited through an opening portion of the shadow mask so that the opening portion of the shadow mask and the coloring material correspond to one-to-one and have the same shape. As shown in FIG. 16, the colored portion 114 formed by the vapor deposition may have the second surface of a flat surface.

However, embodiments are not limited thereto. The colored portion 114 may be formed by forming a colored layer 1140 on the base member 112 and performing a heat-treatment for drying or firing. For example, a coloring ink may be applied by printing and then heat-treated at 100 to 300° C. During the heat-treatment process, a solvent, a resin, and the like may be evaporated. In this instance, if a temperature of the heat-treatment is less than 100° C., a process time of the heat-treatment may increase. If a temperature of the heat-treatment process is higher than 300° C., a deformation of the resin, binder, etc. used during printing may occur, and the solvent may be rapidly evaporated and voids may be formed inside. If the voids are formed as described above, light may be scattered by the voids, and thus, a light transmittance of the first cover member 110 may be lowered.

As shown in FIG. 17, a colored portion 114 formed by the printing as described above may have a kind of protruding portion P at the second surface. The protrusion P may be formed by a surface tension, a spreading phenomenon, or so on of the ink to be printed when the colored portion 114 is formed by printing. The protrusion P may be formed of the same material as the colored portion 114 and may extend from a side surface to protrude from the second surface and thus may surround an edge of the second surface. When the protrusion P is formed, a surface area of the second surface is widened when the colored portion 114 and the first sealing member 131 are bonded to each other to improve a bonding force between the colored portion 114 and the first sealing member 131.

Hereinafter, a solar cell panel according to other embodiments of the invention will be described in detail. The detailed description will be omitted for the same or extremely similar parts as the above description, and only the different parts will be described in detail. It is also within the scope of the invention to combine the above-described embodiments or modified embodiments thereof with the following embodiments or modified embodiments thereof.

Figure 18:
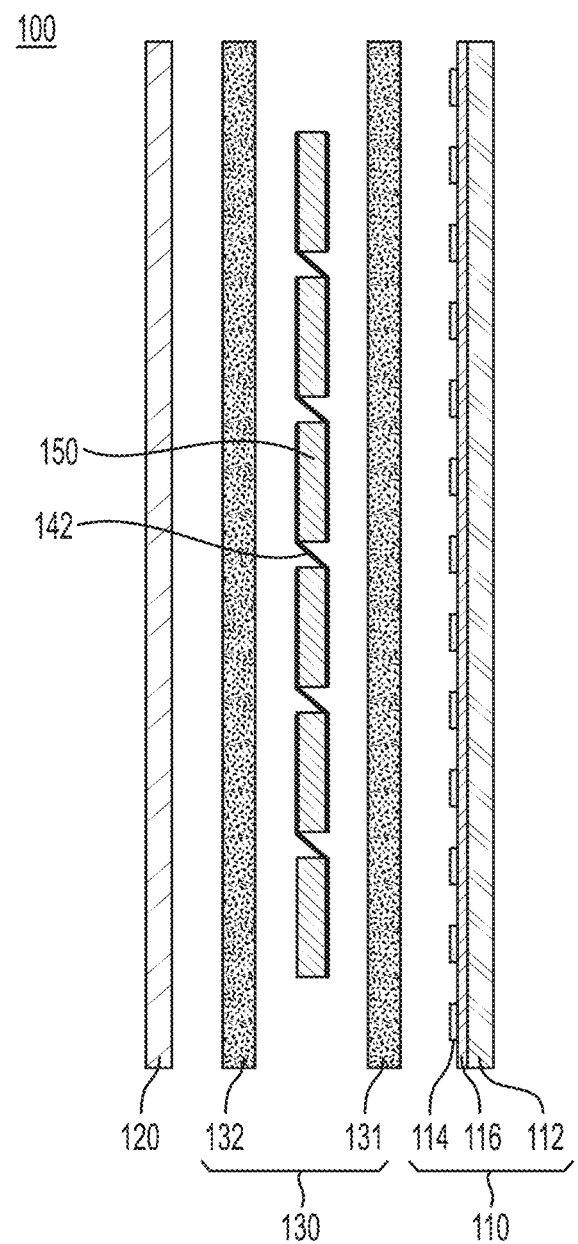
FIG. 18 is an exploded cross-sectional view schematically showing a solar cell panel according to yet another embodiment of the invention.

FIG. 18 is an exploded cross-sectional view schematically showing a solar cell panel according to yet another embodiment of the invention.

Referring to FIG. 18, in the embodiment, a metal oxide layer 116 formed between the base member 112 and the colored portion 114 may be further included. The metal oxide layer 116 can absorb light having a wavelength of 290 to 400 nm in solar light (i.e., ultraviolet ray (UV)). Thus, a coloring material included in the colored portion 114 is protected from ultraviolet rays, and thus, stability and durability of the colored portion 114 can be improved. Therefore, even if the coloring material is a dyestuff, a chemical reaction due to ultraviolet rays is reduced, thereby preventing a color change (for example, yellowing) of the coloring material. Thus, it is possible to minimize a color change that may occur when exposed to solar light for a long period of time, and maintain a good aesthetic property through maintaining an initial color for a long time even when used in the solar cell panel 100 having a building integrated structure.

Also, the yellowing of other members (for example, a sealing member 130) constituting the solar cell panel 100 can also be prevented or minimized by absorbing the ultraviolet ray. Accordingly, a loss of solar light incident on the solar cell 150 can be minimized, and an output of the solar cell panel 100 can be maximized.

The metal oxide layer 116 may include at least one selected from the group consisting of a titanium oxide (TiOx), a zinc oxide (ZnOx), a cesium oxide (CeOx), and a zirconium oxide (ZrOx). The metal oxide layer 116 may be formed by a physical vapor deposition (PVC), a chemical vapor deposition (CVD), an atomic layer deposition (ALD), or a chemical bath deposition (CBD) and may be heat-treated at a temperature of 200 to 600° C. to have a physical property capable of absorbing ultraviolet rays.

In one example, the metal oxide layer 116 may have a thickness of 50 nm to 1.5 µm. When the thickness of the metal oxide layer 116 is less than 50 nm, effect of absorbing ultraviolet rays may not be sufficient. If the thickness of the metal oxide layer 116 exceeds 1.5 µm, solar light may be lost by the metal oxide layer 116.

In addition, for example, the metal oxide layer 116 may have a refractive index (RI) of a range of 2.1 to 2.9 to light having a wavelength of 580 to 600 nm. Then, the metal oxide layer 116 can effectively absorb ultraviolet rays. As described above, the refractive index of the metal oxide layer 116 may be controlled by a heat-treatment. For example, the metal oxide layer 116 may be heat-treated at a temperature of 200 to 600° C. For example, a titanium oxide (TiOx) layer having a thickness of 50 nm may be heat-treated at 600° C. to form a metal oxide layer 116 having a refractive index of 2.1. As another example, a titanium oxide (TiOx) layer having a thickness of 1.5 µm may be heat-treated at 200° C. to form a metal oxide layer 116 having a refractive index of 2.8.

The first cover member 110 may be manufactured by further performing a process of forming a metal oxide layer 116 on the first cover member 110 before a process of forming the colored portion 114.

Figure 19:
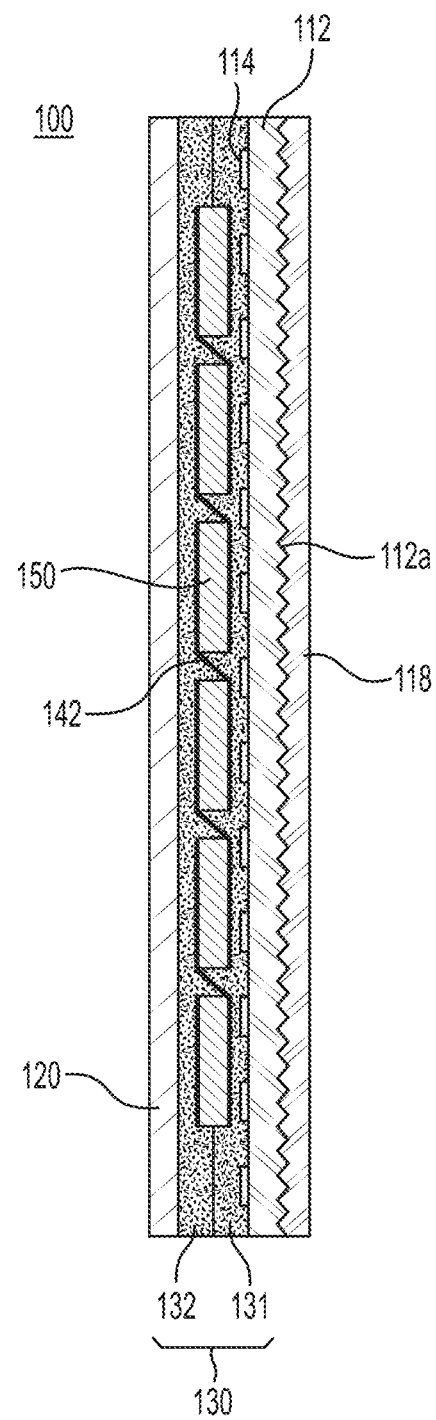
FIG. 19 is a cross-sectional view schematically illustrating a solar cell panel according to still another embodiment of the invention.

FIG. 19 is a cross-sectional view schematically illustrating a solar cell panel according to still another embodiment of the invention.

Referring to FIG. 19, a colored portion 114 may be positioned on an inner surface of a first cover member 110 and a texturing structure 112a for preventing reflection may be formed at an outer surface of the first cover member 110 (that is, an outer surface of a base member 112). The texturing structure 112a may be formed by physical or chemical etching, thereby increasing an amount of light incident into the solar cell panel 100.

An anti-glare layer 118 may be further disposed on the outer surface of the base member 112 to prevent a glare phenomenon. Various structures and types known as an anti-glare layer may be applied to the anti-glare layer 118.

In FIG. 19, it is exemplified that the colored portion 114 is formed as a layer formed separately on the base member 112 as shown in FIG. 15, but embodiments are not limited thereto. A structure in which the colored portion 114 is integrated with the base member 112 as shown in FIG. 2 may be applied. Various other variations are possible.

The second cover member 120 or the cover portion 124 may have a desired property by any of various structure. For example, the second cover member 120 or the cover portion 124 may prevent reflection or may improve a reflection property by forming a texturing structure or an etching process. For example, a metal film is formed and etched to form the cover portion 124.

The above-described embodiments and modified embodiments may be freely combined with each other and are also within the scope of the invention.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A solar cell panel comprising:
   a solar cell;
   a sealing member for sealing the solar cell;
   a first cover member positioned at a first surface of the solar cell on a first side of the sealing member; and
   a second cover member positioned at a second surface of the solar cell on a second side of the sealing member,
   wherein the first cover member comprises a base member and a colored portion having a lower light transmittance than the base member and partially formed on the base member to form a colored region,
   wherein the second cover member comprises a cover portion having a lower brightness than the colored portion of the first cover member and positioned at an inactive region of the solar cell panel where the solar cell is not positioned,
   wherein the base member comprises a tempered glass substrate,
   wherein the colored portion includes a ceramic frit and is formed of an integrated portion with the tempered glass substrate where at least a part of the ceramic frit and a material of the tempered glass substrate are mixed,
   wherein the colored portion in the colored region has a plurality of portions and a light transmitting portion interposed between the plurality of portions, and
   wherein the colored portion or the plurality of portions comprises an overlapped portion overlapped with the solar cell.

2. The solar cell panel of claim 1, wherein the plurality of portions has at least one of a plurality of dots or a plurality of stripe shapes.

3. The solar cell panel of claim 1, wherein the colored portion has a width of 0.2 to 10 mm, and
wherein a ratio of a total area of the colored portion to a total area of the colored region is in a range of 0.1 to 0.95.

4. The solar cell panel of claim 3, wherein the ratio of the total area of the colored portion to the total area of the colored region is in a range of 0.1 to 0.5.

5. The solar cell panel of claim 1,
wherein the colored portion includes a pigment or a dyestuff.

6. The solar cell panel of claim 1, wherein the colored portion is positioned at a surface of the tempered glass and partially formed at the tempered glass in a thickness direction of the base member at one surface of the base member.

7. The solar cell panel of claim 1, wherein the colored portion has a first portion that is recessed into the base member and a second portion that protrudes from a substrate surface of the base member.

8. The solar cell panel of claim 7, wherein a thickness of the first portion is greater than a thickness of the second portion.

9. The solar cell panel of claim 1, wherein a first cover ratio is a ratio of an area of the colored portion to an area of the colored region,
wherein a second cover ratio is a ratio of an area of the cover portion positioned at the inactive region to an area of the inactive region, and
wherein the second cover ratio is greater than the first cover ratio.

10. The solar cell panel of claim 1, wherein a color of the cover portion is at least one of an achromatic color other than white, an opaque color, or a same color as that of the solar cell.

11. The solar cell panel of claim 1, wherein a color of the cover portion is at least one of black, gray, blue, green, brown, a same color as that of the solar cell, or a mixed color thereof.

12. The solar cell panel of claim 1, wherein the cover portion has at least one of a dot shape, a stripe shape, or a shape covering at least an entire portion of the inactive region.

13. The solar cell panel of claim 1, wherein the cover portion is formed at least one of entirely on the second cover member or partially at a portion including the inactive region.

14. A solar cell panel comprising:
a solar cell;
a sealing member for sealing the solar cell;
a first cover member positioned at a first surface of the solar cell on a first side of the sealing member; and
a second cover member positioned at a second surface of the solar cell on a second side of the sealing member,
wherein the first cover member comprises a base member and a colored portion having a lower light transmittance than the base member and partially formed on the base member to form a colored region,
wherein the second cover member comprises a cover portion positioned at an inactive region of the solar cell panel where the solar cell is not positioned,
wherein a first cover ratio is a ratio of an area of the colored portion to an area of the colored region, a second cover ratio is a ratio of an area of the cover portion positioned at the inactive region to an area of the inactive region, and the second cover ratio is greater than the first cover ratio,
wherein the base member comprises a tempered glass substrate,
wherein the colored portion includes a ceramic frit and is formed of an integrated portion with the tempered glass substrate where at least a part of the ceramic frit and a material of the tempered glass substrate are mixed,
wherein the colored portion in the colored region has a plurality of portions and a light transmitting portion interposed between the plurality of portions, and
wherein the colored portion or the plurality of portions comprises an overlapped portion overlapped with the solar cell.

15. The solar cell panel of claim 14, wherein a color of the cover portion is at least one of an achromatic color other than white, an opaque color, or a same color as that of the solar cell.

16. The solar cell panel of claim 14, wherein a color of the cover portion is at least one of black, gray, blue, green, brown, a same color as that of the solar cell, or a mixed color thereof.

17. The solar cell panel of claim 14, wherein the second cover ratio is in a range of 0.5 to 1.

18. The solar cell panel of claim 14, wherein the cover portion has at least one of a dot shape, a stripe shape, or a shape covering at least an entire portion of the inactive region.

19. The solar cell panel of claim 14, wherein the cover portion is formed at least one of entirely on the second cover member or partially at a portion including the inactive region.

20. The solar cell panel of claim 14, wherein the solar cell panel has a building integrated structure.

* * * * *